United States Patent
Ahn et al.

(10) Patent No.: US 7,135,369 B2
(45) Date of Patent: Nov. 14, 2006

(54) ATOMIC LAYER DEPOSITED $ZRAL_XO_Y$ DIELECTRIC LAYERS INCLUDING $ZR_4ALO_9$

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 279 days.

(21) Appl. No.: 10/403,734

(22) Filed: Mar. 31, 2003

(65) Prior Publication Data

US 2005/0054165 A1  Mar. 10, 2005

(51) Int. Cl.
- H01L 21/8242 (2006.01)
- H01L 21/336 (2006.01)
- H01L 21/20 (2006.01)
- H01L 21/28 (2006.01)
- H01L 21/44 (2006.01)

(52) U.S. Cl. ............ 438/253; 438/287; 438/396; 438/581; 438/778; 438/785

(58) Field of Classification Search ........ 438/287, 438/581, 778, 785, 253, 396
See application file for complete search history.

(56) References Cited

U.S. PATENT DOCUMENTS

| | | | |
|---|---|---|---|
| 4,058,430 A | 11/1977 | Suntola et al. | 427/299.13 |
| 4,413,022 A | 11/1983 | Suntola et al. | 117/89 |
| 5,055,319 A | 10/1991 | Bunshah et al. | 427/567 |
| 5,625,233 A | 4/1997 | Cabral, Jr. et al. | 257/771 |
| 5,840,897 A | 11/1998 | Kirlin et al. | 546/2 |
| 5,879,459 A * | 3/1999 | Gadgil et al. | 118/715 |
| 5,916,365 A | 6/1999 | Sherman | 117/92 |
| 6,013,553 A | 1/2000 | Wallace et al. | 438/287 |
| 6,020,024 A | 2/2000 | Maiti et al. | 438/287 |
| 6,025,627 A | 2/2000 | Forbes et al. | 257/321 |
| 6,027,961 A | 2/2000 | Maiti et al. | 438/199 |
| 6,200,893 B1 | 3/2001 | Sneh | |
| 6,207,589 B1 | 3/2001 | Ma et al. | 438/785 |
| 6,217,645 B1 | 4/2001 | Vaartstra | 108/287.8 |
| 6,225,237 B1 | 5/2001 | Vaartstra | 438/178 |

(Continued)

FOREIGN PATENT DOCUMENTS

EP    1096042    5/2001

(Continued)

OTHER PUBLICATIONS

Chang, Hyo S., et al., "Excellent thermal stability of $Al_2O_3/ZrO_2/Al_2O_3$ stack structure of metal-oxide-semiconductor gate dielectrics application," *Appl. Phys. Lett.*, 80, 18, (2002),3385-7.

(Continued)

*Primary Examiner*—William M. Brewster
(74) *Attorney, Agent, or Firm*—Schwegman, Lundberg, Woessner & Kluth, P.A.

(57) ABSTRACT

An atomic layer deposited $ZrAl_xO_y$ dielectric layer and a method of fabricating such a dielectric layer produce a reliable dielectric layer having an equivalent oxide thickness thinner than attainable using $SiO_2$. Pulsing a zirconium-containing precursor onto a substrate, pulsing a first oxygen-containing precursor, pulsing an aluminum-containing precursor, and pulsing a second oxygen-containing precursor to form $ZrAl_xO_y$ by atomic layer deposition provides a dielectric layer with a relatively high dielectric constant as compared with silicon oxide and with a relatively low leakage current. Dielectric layers containing atomic layer deposited $ZrAl_xO_y$ are thermodynamically stable such that the $ZrAl_xO_y$ will have minimal reactions with a silicon substrate or other structures during processing.

65 Claims, 8 Drawing Sheets

U.S. PATENT DOCUMENTS

| | | |
|---|---|---|
| 6,273,951 B1 | 8/2001 | Vaartstra .................... 117/107 |
| 6,291,866 B1 | 9/2001 | Wallace et al. ............. 257/918 |
| 6,294,813 B1 | 9/2001 | Forbes et al. ................ 257/321 |
| 6,297,539 B1 | 10/2001 | Ma et al. ..................... 257/418 |
| 6,313,035 B1 | 11/2001 | Sandhu et al. .............. 438/681 |
| 6,331,465 B1 | 12/2001 | Forbes et al. ................ 438/268 |
| 6,368,398 B1 | 4/2002 | Vaartstra ...................... 438/3 |
| 6,404,027 B1 | 6/2002 | Hong et al. |
| 6,420,230 B1 | 7/2002 | Derderian et al. ........... 438/255 |
| 6,420,279 B1 | 7/2002 | Ono et al. ................... 438/785 |
| 6,441,417 B1 | 8/2002 | Zhang et al. |
| 6,444,592 B1* | 9/2002 | Ballantine et al. .......... 438/770 |
| 6,448,192 B1 | 9/2002 | Kaushik ...................... 438/785 |
| 6,451,641 B1 | 9/2002 | Halliyal et al. .............. 438/300 |
| 6,451,662 B1 | 9/2002 | Chudzik et al. ............. 438/386 |
| 6,451,695 B1 | 9/2002 | Sneh ........................... 438/685 |
| 6,455,717 B1 | 9/2002 | Vaartstra ..................... 556/1 |
| 6,482,740 B1 | 11/2002 | Soininen et al. ............. 438/686 |
| 6,495,436 B1 | 12/2002 | Ahn et al. .................... 438/591 |
| 6,509,280 B1 | 1/2003 | Choi |
| 6,514,828 B1 | 2/2003 | Ahn et al. .................... 438/297 |
| 6,527,866 B1 | 3/2003 | Matijasevic et al. ......... 118/219 |
| 6,534,357 B1 | 3/2003 | Basceri et al. ............... 438/239 |
| 6,534,420 B1 | 3/2003 | Ahn et al. .................... 438/768 |
| 6,537,613 B1 | 3/2003 | Senzaki et al. .............. 427/250 |
| 6,541,079 B1 | 4/2003 | Bojarczuk, Jr. et al. |
| 6,541,353 B1 | 4/2003 | Sandhu et al. ............... 438/478 |
| 6,544,875 B1 | 4/2003 | Wilk ........................... 438/591 |
| 6,551,893 B1 | 4/2003 | Zheng et al. ................ 438/387 |
| 6,559,472 B1 | 5/2003 | Sandhu et al. ................ 257/31 |
| 6,573,199 B1 | 6/2003 | Sandhu et al. ............... 432/798 |
| 6,586,349 B1* | 7/2003 | Jeon et al. ................... 438/785 |
| 6,586,792 B1 | 7/2003 | Ahn et al. .................... 257/295 |
| 6,596,636 B1 | 7/2003 | Sandhu et al. ............... 438/676 |
| 6,608,378 B1 | 8/2003 | Ahn et al. .................... 257/701 |
| 6,613,656 B1 | 9/2003 | Li ................................ 438/381 |
| 6,613,702 B1 | 9/2003 | Sandhu et al. ............... 438/798 |
| 6,620,670 B1 | 9/2003 | Song et al. ................... 438/216 |
| 6,627,260 B1 | 9/2003 | Derderian et al. ........... 427/301 |
| 6,627,503 B1 | 9/2003 | Ma et al. ..................... 438/287 |
| 6,632,279 B1 | 10/2003 | Ritala et al. ................. 117/101 |
| 6,639,267 B1 | 10/2003 | Eldridge ...................... 257/310 |
| 6,642,567 B1 | 11/2003 | Marsh ......................... 257/305 |
| 6,642,573 B1 | 11/2003 | Halliyal et al. |
| 6,645,882 B1 | 11/2003 | Halliyal et al. .............. 438/785 |
| 6,652,924 B1 | 11/2003 | Sherman ...................... 427/576 |
| 6,660,660 B1 | 12/2003 | Haukka et al. ............... 438/778 |
| 6,661,058 B1 | 12/2003 | Ahn et al. .................... 257/344 |
| 6,673,701 B1 | 1/2004 | Marsh et al. ................. 438/493 |
| 6,674,138 B1 | 1/2004 | Halliyal et al. .............. 257/411 |
| 6,682,602 B1 | 1/2004 | Vaartstra ..................... 118/715 |
| 6,683,005 B1 | 1/2004 | Sandhu et al. ............... 438/715 |
| 6,683,011 B1 | 1/2004 | Smith et al. ................. 438/785 |
| 6,686,212 B1 | 2/2004 | Conley, Jr. et al. ............. 438/3 |
| 6,696,332 B1 | 2/2004 | Visokay et al. .............. 438/216 |
| 6,699,745 B1 | 3/2004 | Banerjee et al. ............. 438/278 |
| 6,709,989 B1 | 3/2004 | Ramdani et al. ............. 438/763 |
| 6,713,846 B1 | 3/2004 | Senzaki ....................... 257/634 |
| 6,730,575 B1 | 5/2004 | Eldridge ...................... 438/396 |
| 6,750,066 B1 | 6/2004 | Cheung et al. ................ 438/3 |
| 6,762,114 B1 | 7/2004 | Chambers ................... 438/591 |
| 6,767,582 B1 | 7/2004 | Elers |
| 6,767,795 B1 | 7/2004 | Ahn et al. .................... 438/287 |
| 6,770,536 B1 | 8/2004 | Wilk et al. ................... 438/287 |
| 6,777,353 B1 | 8/2004 | Putkonen ..................... 438/785 |
| 6,778,441 B1 | 8/2004 | Forbes et al. |
| 6,780,704 B1 | 8/2004 | Raaijmakers et al. ........ 438/239 |
| 6,787,413 B1 | 9/2004 | Ahn ............................. 438/240 |
| 6,800,567 B1 | 10/2004 | Choi ............................ 438/763 |
| 6,803,311 B1 | 10/2004 | Choi ............................ 438/674 |
| 6,808,978 B1 | 10/2004 | Kim ............................. 438/239 |
| 6,812,100 B1 | 11/2004 | Ahn et al. .................... 438/287 |
| 6,831,315 B1 | 12/2004 | Raaijmakers et al. ........ 257/296 |
| 6,844,203 B1 | 1/2005 | Ahn et al. ...................... 438/3 |
| 6,844,260 B1 | 1/2005 | Sarigiannis et al. .......... 438/680 |
| 6,930,059 B1 | 8/2005 | Conley, Jr. et al. |
| 6,952,032 B1 | 10/2005 | Forbes et al. |
| 6,958,302 B1 | 10/2005 | Ahn et al. |
| 6,979,855 B1 | 12/2005 | Ahn et al. |
| 7,026,694 B1 | 4/2006 | Ahn et al. |
| 7,045,430 B1 | 5/2006 | Ahn et al. |
| 7,049,192 B1 | 5/2006 | Ahn et al. |
| 2001/0009695 A1 | 7/2001 | Saanila et al. ............ 427/253.36 |
| 2001/0042505 A1 | 11/2001 | Vaartstra ..................... 117/104 |
| 2002/0001971 A1* | 1/2002 | Cho ............................. 438/765 |
| 2002/0024080 A1 | 2/2002 | Derderian et al. ........... 257/301 |
| 2002/0025628 A1 | 2/2002 | Derderian et al. ........... 438/253 |
| 2002/0046705 A1 | 4/2002 | Sandhu et al. ............... 118/719 |
| 2002/0068466 A1 | 6/2002 | Lee et al. ..................... 438/765 |
| 2002/0086555 A1 | 7/2002 | Ahn et al. .................... 438/783 |
| 2002/0094632 A1 | 7/2002 | Agarwal et al. ............. 438/239 |
| 2002/0110991 A1 | 8/2002 | Li ................................ 438/347 |
| 2002/0111001 A1 | 8/2002 | Ahn et al. .................... 438/592 |
| 2002/0122885 A1 | 9/2002 | Ahn .......................... 427/255.21 |
| 2002/0142536 A1 | 10/2002 | Zhang et al. |
| 2002/0146916 A1 | 10/2002 | Irino et al. ................... 438/785 |
| 2002/0155688 A1 | 10/2002 | Ahn et al. .................... 438/572 |
| 2002/0155689 A1 | 10/2002 | Ahn et al. .................... 438/592 |
| 2002/0164420 A1 | 11/2002 | Derderian et al. ......... 427/248.1 |
| 2002/0177282 A1 | 11/2002 | Song |
| 2002/0192974 A1 | 12/2002 | Ahn et al. .................... 438/722 |
| 2002/0192975 A1 | 12/2002 | Ahn ............................. 438/722 |
| 2002/0192979 A1 | 12/2002 | Ahn ............................. 438/772 |
| 2002/0195056 A1 | 12/2002 | Sandhu et al. ............... 118/719 |
| 2003/0003635 A1 | 1/2003 | Paranjpe et al. |
| 2003/0003702 A1 | 1/2003 | Ahn et al. .................... 438/591 |
| 2003/0003722 A1 | 1/2003 | Vaartstra ..................... 438/656 |
| 2003/0003730 A1 | 1/2003 | Li ................................ 438/686 |
| 2003/0017717 A1 | 1/2003 | Ahn et al. .................... 438/768 |
| 2003/0032270 A1 | 2/2003 | Snyder et al. |
| 2003/0042526 A1 | 3/2003 | Weimer ....................... 257/309 |
| 2003/0045060 A1 | 3/2003 | Ahn ............................. 438/287 |
| 2003/0045078 A1 | 3/2003 | Ahn et al. .................... 438/585 |
| 2003/0045082 A1 | 3/2003 | Eldridge et al. ............. 438/593 |
| 2003/0048666 A1 | 3/2003 | Eldridge et al. ......... 365/185.28 |
| 2003/0049942 A1 | 3/2003 | Haukka et al. ............... 438/778 |
| 2003/0059535 A1* | 3/2003 | Luo et al. ................. 427/255.28 |
| 2003/0062261 A1 | 4/2003 | Shindo |
| 2003/0089314 A1 | 5/2003 | Matsuki et al. .............. 118/715 |
| 2003/0119246 A1 | 6/2003 | Ahn ............................. 438/215 |
| 2003/0119291 A1 | 6/2003 | Ahn et al. .................... 438/591 |
| 2003/0124794 A1 | 7/2003 | Girardie ...................... 438/250 |
| 2003/0132491 A1 | 7/2003 | Ahn ............................. 257/411 |
| 2003/0157764 A1 | 8/2003 | Ahn et al. .................... 438/212 |
| 2003/0170389 A1 | 9/2003 | Sandhu ..................... 427/28.28 |
| 2003/0170403 A1 | 9/2003 | Doan et al. .................. 427/569 |
| 2003/0175411 A1 | 9/2003 | Kodas et al. .................. 427/58 |
| 2003/0181039 A1 | 9/2003 | Sandhu et al. ............... 438/685 |
| 2003/0181060 A1 | 9/2003 | Asai et al. |
| 2003/0183156 A1 | 10/2003 | Dando et al. ................. 117/84 |
| 2003/0203626 A1 | 10/2003 | Derderian et al. ........... 438/689 |
| 2003/0207032 A1 | 11/2003 | Ahn et al. ................. 427/299.34 |
| 2003/0207540 A1 | 11/2003 | Ahn et al. .................... 438/287 |
| 2003/0207593 A1 | 11/2003 | Derderian et al. ........... 438/778 |
| 2003/0222300 A1 | 12/2003 | Basceri et al. ............... 257/309 |
| 2003/0224600 A1 | 12/2003 | Cao et al. ..................... 438/684 |
| 2003/0227033 A1 | 12/2003 | Ahn et al. .................... 257/213 |
| 2003/0228747 A1 | 12/2003 | Ahn et al. .................... 438/591 |
| 2003/0232511 A1 | 12/2003 | Metzner et al. .............. 438/785 |
| 2003/0235961 A1 | 12/2003 | Metzner et al. .............. 438/287 |
| 2004/0004244 A1 | 1/2004 | Ahn et al. .................... 257/314 |
| 2004/0009679 A1 | 1/2004 | Yeo et al. ..................... 438/785 |
| 2004/0023461 A1 | 2/2004 | Ahn et al. .................... 438/287 |
| 2004/0033681 A1 | 2/2004 | Ahn et al. .................... 257/410 |

| | | | |
|---|---|---|---|
| 2004/0033701 A1 | 2/2004 | Ahn et al. ................... 438/287 |
| 2004/0038525 A1 | 2/2004 | Meng et al. ................. 438/656 |
| 2004/0043541 A1 | 3/2004 | Ahn ........................... 438/428 |
| 2004/0043557 A1 | 3/2004 | Haukka et al. .............. 438/240 |
| 2004/0043569 A1 | 3/2004 | Ahn ........................... 438/287 |
| 2004/0043635 A1 | 3/2004 | Vaartstra ..................... 438/785 |
| 2004/0099889 A1 | 5/2004 | Frank et al. ................. 257/288 |
| 2004/0110348 A1 | 6/2004 | Ahn et al. ................... 438/287 |
| 2004/0110391 A1 | 6/2004 | Ahn et al. ................... 438/778 |
| 2004/0135186 A1* | 7/2004 | Yamamoto .................. 257/296 |
| 2004/0144980 A1 | 7/2004 | Ahn et al. ..................... 257/69 |
| 2004/0159863 A1 | 8/2004 | Eldridge et al. |
| 2004/0161899 A1 | 8/2004 | Luo et al. |
| 2004/0164357 A1 | 8/2004 | Ahn et al. ................... 257/368 |
| 2004/0168627 A1 | 9/2004 | Conley, Jr. et al. ............ 117/89 |
| 2004/0171280 A1 | 9/2004 | Conley, Jr. et al. ......... 438/778 |
| 2004/0175882 A1 | 9/2004 | Ahn et al. ................... 438/240 |
| 2004/0183108 A1 | 9/2004 | Ahn ........................... 257/288 |
| 2004/0185654 A1 | 9/2004 | Ahn ........................... 438/635 |
| 2004/0214399 A1 | 10/2004 | Ahn et al. ................... 438/785 |
| 2004/0222476 A1 | 11/2004 | Ahn et al. ................... 438/691 |
| 2004/0262700 A1 | 12/2004 | Ahn et al. ................... 257/410 |
| 2005/0020017 A1 | 1/2005 | Ahn et al. ................... 438/287 |
| 2005/0023578 A1 | 2/2005 | Bhattacharyya ............. 257/288 |
| 2005/0023584 A1 | 2/2005 | Derderian et al. ........... 257/296 |
| 2005/0023594 A1 | 2/2005 | Ahn et al. ................... 257/314 |
| 2005/0023603 A1 | 2/2005 | Eldridge et al. |
| 2005/0023624 A1 | 2/2005 | Ahn et al. ................... 257/410 |
| 2005/0023625 A1 | 2/2005 | Ahn et al. ................... 257/410 |
| 2005/0023626 A1 | 2/2005 | Ahn et al. ................... 257/410 |
| 2005/0023627 A1 | 2/2005 | Ahn et al. ................... 438/283 |
| 2005/0026374 A1 | 2/2005 | Ahn et al. ................... 257/200 |
| 2005/0029547 A1 | 2/2005 | Ahn et al. ................... 257/410 |
| 2005/0029604 A1 | 2/2005 | Ahn et al. ................... 257/410 |
| 2005/0029605 A1 | 2/2005 | Ahn et al. ................... 438/216 |
| 2005/0030825 A1 | 2/2005 | Ahn |
| 2005/0032292 A1 | 2/2005 | Ahn et al. ................... 118/715 |
| 2005/0034662 A1 | 2/2005 | Ahn ........................... 438/240 |
| 2005/0037563 A1 | 2/2005 | Ahn ........................... 257/410 |
| 2005/0138262 A1 | 6/2005 | Forbes |
| 2005/0145959 A1* | 7/2005 | Forbes et al. ............... 257/412 |
| 2005/0227442 A1 | 10/2005 | Ahn et al. |
| 2005/0277256 A1 | 12/2005 | Ahn et al. |
| 2005/0280067 A1 | 12/2005 | Ahn et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0023513 A1* | 2/2006 | Forbes et al. ........... 365/185.28 |
| 2006/0024975 A1 | 2/2006 | Ahn et al. |
| 2006/0028867 A1* | 2/2006 | Forbes et al. ........... 365/185.05 |
| 2006/0028869 A1* | 2/2006 | Forbes et al. ........... 365/185.17 |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046522 A1 | 3/2006 | Ahn et al. |

FOREIGN PATENT DOCUMENTS

WO    WO-02/43115    5/2002

OTHER PUBLICATIONS

Chen, P. J., et al., "Thermal stability and scalability of Zr-aluminate-based high-k gate stacks", *Symposium on VLSI Technology Digest*, (2002), 192-3.

Da Rosa, E.B.O. , et al., "Annealing of $ZrAl_xO_y$ Ultrathin Films on Si in Vacuum or in $O_2$", *J. of the Electrochemical Society*, 148 (12), (2001),G695-G703.

Jeon, Sanghun , et al., "Ultrathin nitrided-nanolaminated ($Al_2O_3$/$ZrO_2$/$Al_2O_3$) for metal-oxide semiconductor gate dielectric applications," *J. Vac. Sci. Techincal. B*. 20(3), (2002), 1143-5.

Perkins, Charles M., et al., "Electrical and materials properties of $ZrO_2$ gate dielectrics grown by atomic layer chemical vapor depositon," *Applied Physics Letters*, 78(16), (Apr. 2001), 2357-2359.

Rahtu, Antti , et al., "Atomic layer Deposition of Zirconium Titanium Oxide from Titanium Isopropoxide and Zirconium Chloride," *Chemistry of Materials*, 13(5), (May 2001), 1528-1532.

Sneh, Ofer , "Thin film atomic layer deposition equipment for semiconductor processing", *Thin Solid Films*, 402(1-2), (Jan. 2002),248-261.

Colombo, D., et al., "Anhydrous Metal Nitrates as Volatile Single Source Precursors for the CVD of Metal Oxide Films", *Communications, Department of EE, U of M, MN*, (Jul. 7, 1998), 3 pages.

Copel, M., "Structure and stability of ultrathin zirconium oxide layers on Si(001)", *Applied Physics Letters*, 76(4), (Jan. 2000), 436-438.

Forsgren, Katarina, "CVD and ALD of Group IV- and V-Oxides for Dielectric Applications", *Comprehensive Summaries of Uppsala Dissertation form the Faculty of Science and Technology*, 665, (2001).

Gusev, E P., et al., "Ultrathin High-K Dielectrics Grown by Atomic Layer Deposition: A Comparative Study of $ZrO_2$, $HfO_2$, $Y_2O_3$ and $Al_2O_3$", *Electrochemical Society Proceedings vol. 2001-9*, (2001), 189-195.

Gutowski, M J., "Thermodynamic Stabillity of high-K dielectric metal oxides $ZrO_2$ and $HfO_2$ in contact with Si and $SiO_2$" , *Applied Physics Letters*, 80(11), (Mar. 18, 2002), 1897-1899.

Hubbard, K. J., "Thermodynamic stability of binary oxides in contact with silicon", *Journal of Materials Research*, 11(11), (Nov. 1996), 2757-2776.

Jeong, Chang-Wook, et al., "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001), 285-289.

Kim, C T., et al., "Application of $Al_2O_3$ Grown by Atomic Layer Deposition to DRAM and FeRAM", *International Symposium in Integrated Ferroelectrics*, (Mar. 2000), 316.

Kim, Y, et al., "Substrate dependence on the optical properties of $Al_2O_3$ films grown by atomic layer deposition", *Applied Physics Letters*, 71(25), (Dec. 22, 1997), 3604-3606.

Kukli, Kaupo, et al., "Dielectric Properties of Zirconium Oxide Grown by Atomic Layer Deposition from Iodide Precursor", *Journal of The Electrochemical Society*, 148(12), (2001), F227-F232.

Kukli, Kaupo, et al., "Influence of thickness and growth temperature on the properties of zirconium oxide films growth by atomic layer depoosition on silicon", *Thin Solid Films*, 410(1-2), (2002), 53-60.

Leskela, M, et al., "ALD precursor chemistry: Evolution and future challenges", *Journal de Physique IV (Proceedings)*, 9(8), (Sep. 1999), 837-852.

Luo, Z J., et al., "Ultra-thin $ZrO_2$ (or Silicate) with High Thermal Stability for CMOS Gate Applications", *2001 Symposium on VLSI Technology Digest of Technical Papers*, (2001), 135-136.

Nakajima, Anri, et al., "Atomic-layer deposition of $ZrO_2$ with a Si nitride barrier layer", *Applied Physics Letters*, 81(15), (Oct. 2002),2824-2826.

Neumayer, D A., et al., "Materials characterization of $ZrO_2$-$SiO_2$ and $HfO_2$-$SiO_2$ binary oxides deposited by chemical solution deposition", *Journal of Applied Physics*, 90(4), (Aug. 15, 2001), 1801-1808.

Poveshchenko, V P., et al., "Investigation of the phase composition of films of zirconium, hafnium and yttrium oxides", *Soviet Journal of Optical Technology*, 51(5), (1984), 277-279.

Ritala, Mikko, "Atomic Layer Epitaxy Growth of Titanium, Zirconium and Hafnium Dioxide Thin Films", *Annales Academiae Scientiarum Fennicae*, (1994), 24-25.

Ritala, Mikko, et al., "Zirconium dioxide thin films deposited by ALE using zirconium tetrachloride as precursor", *Applied Surface Science*, 75, (Jan. 1994), 333-340.

Shin, Chang H., et al., "Fabrication and Characterization of MFISFET using Al2O3 Insulating Layer for Non-Volatile Memory", *12th International Symposium in Integrated Ferroelectrics*, (Mar. 2000), 1-9.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (Jun. 29, 2000), 105-14.

Suntola, T., "Atomic Layer Epitaxy", *Handbook of Crystal Growth, 3; Thin Films of Epitaxy, Part B: Growth Mechanics and Dynamics*, Amsterdam,(1994), 602-663.

Wilk, G D., "Hafnium and zirconium silicates for advanced gate dielectrics", *Journal of Applied Physics*, 87(1), (Jan. 2000), 484-492.

Wilk, G. D., "High-K gate dielectrics: Current status and materials properties considerations", *Jouranl of Applied Physics*, 89(10), (May 2001), 5243-5275.

Zhang, H., "Atomic Layer Deposition of High Dielectric Constant Nanolaminates", *Journal of The Electrochemical Society*, 148(4), (Apr. 2001), F63-F66.

Zhang, H, "High permittivity thin film nanolaminates", *Journal of Applied Physics*, 87 (4), (Feb. 2000), 1921-1924.

Suntola, Tuomo, "Atomic layer epitaxy", *Thin Solid Films*, 216(1), (Aug. 28, 1992),84-89.

Ritala, M., et al., "Atomic layer deposition of oxide thin films with metal alkoxides as oxygen sources", *Science*, 288(5464), (Apr. 14, 2000),319-321.

* cited by examiner

ATOMIC LAYER DEPOSITED ZRAL$_x$O$_Y$ DIELECTRIC LAYERS INCLUDING ZR$_4$ALO$_9$

CROSS REFERENCE TO RELATED APPLICATIONS

This application is related to the following commonly assigned U.S. patent applications, which are herein incorporated by reference in their entirety:

U.S. application Ser. No. 10/137,058, entitled: "Atomic Layer Deposition and Conversion," filed 2 May 2002, U.S. application Ser. No. 10/137,168, entitled: "Methods, Systems, and Apparatus for Atomic-Layer Deposition of Aluminum Oxides in Integrated Circuits," filed 2 May 2002, and U.S. application Ser. No. 09/797,324, entitled: "Methods, Systems, and Apparatus for Uniform Chemical-Vapor Depositions," filed 1 Mar. 2001, now U.S. Pat. No. 6,852,167.

TECHNICAL FIELD

This application relates generally to semiconductor devices and device fabrication and, more particularly, to dielectric layers and their method of fabrication.

BACKGROUND

The semiconductor device industry has a market driven need to improve speed performance, improve its low static (off-state) power requirements, and adapt to a wide range of power supply and output voltage requirements for its silicon based microelectronic products. In particular, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs). The smaller devices are frequently powered by batteries. There is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present subject matter could be incorporated into the transistor shown in FIG. 1 to form a transistor according to the present subject matter. A transistor 100 is fabricated in a substrate 110 that is typically silicon, but could be fabricated from other semiconductor materials as well. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Although gate dielectric 140 may be formed from materials other than oxides, gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one design criteria is gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

DETAILED DESCRIPTION

Figure 1:
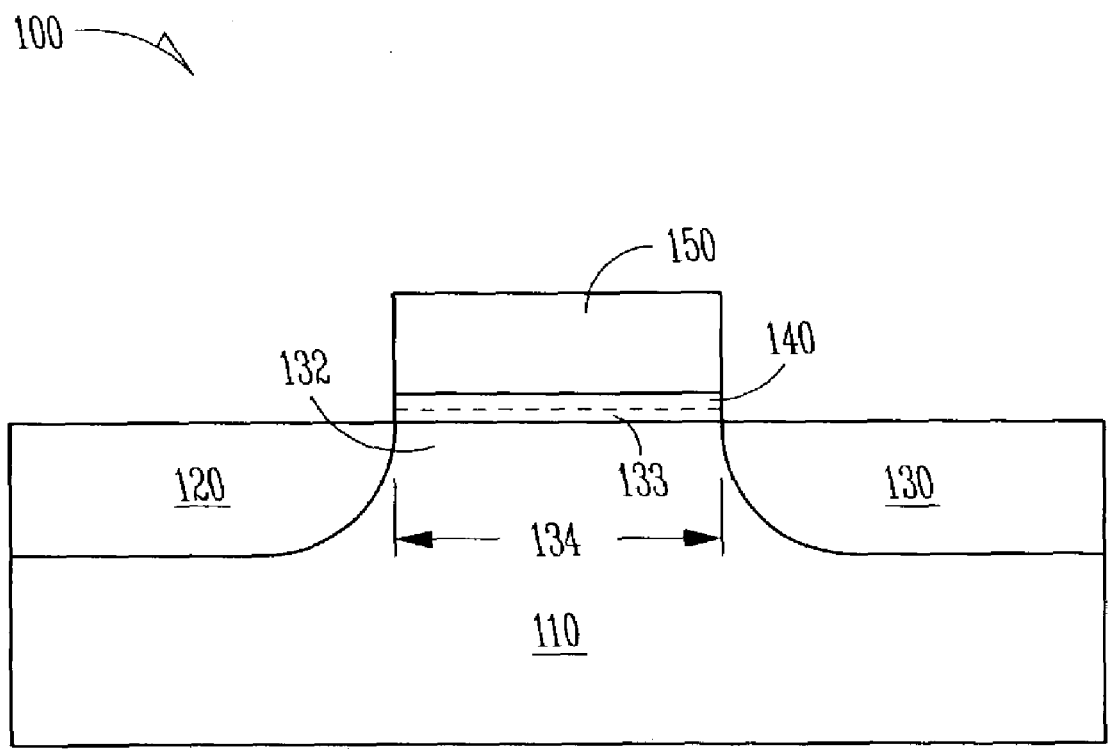
FIG. 1 shows a configuration of a transistor having a gate dielectric containing atomic layer deposited $ZrAl_xO_y$ according to various embodiments of the present subject matter.

The following detailed description refers to the accompanying drawings that show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form the integrated circuit (IC) structure of the present subject matter. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present subject matter is defined only by the appended claims, along with the full scope of equivalents to which such claims are entitled.

An embodiment for a method for forming a dielectric layer containing zirconium aluminum oxide, $ZrAl_xO_y$, by atomic layer deposition includes pulsing a precursor containing zirconium onto a substrate, pulsing a first precursor containing oxygen, pulsing a precursor containing aluminum, and pulsing a second precursor containing oxygen. In an embodiment, a layer of $ZrAl_xO_y$ is formed on a substrate by atomic layer deposition with an interfacial layer of silicon oxide or a silicate limited to significantly less than ten angstroms.

A dielectric layer containing $ZrAl_xO_y$ has a larger dielectric constant than silicon dioxide, a relatively small leakage current, and good stability with respect to a silicon based substrate. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. Embodiments include structures for capacitors, transistors, memory devices, and electronic systems with dielectric layers containing atomic layer deposited $ZrAl_xO_y$, and methods for forming such structures.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. The equivalent oxide thickness, $t_{eq}$, is defined as the thickness of a theoretical $SiO_2$ layer that would have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region may result in $t_{eq}$ being from 3 to 6 Angstroms (Å) larger than the $SiO_2$ thickness, t. Thus, with the semiconductor industry driving to scale the gate dielectric equivalent oxide thickness to under 10 Å, the physical thickness for a $SiO_2$ layer used for a gate dielectric would be need to be approximately 4 to 7 Å.

Additional characteristics for a $SiO_2$ layer depend on the gate electrode used in conjunction with the $SiO_2$ gate dielectric. Using a conventional polysilicon gate results in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large bandgap of $SiO_2$ (8.9 eV) making it a good insulator from electrical conduction. Signification reductions in its bandgap would eliminate it as a material for a gate dielectric. As the thickness of a $SiO_2$ layer decreases, the number of atomic layers, or monolayers of the $SiO_2$ decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full bandgap. The lack of a full bandgap in a $SiO_2$ gate dielectric could cause an effective short between an underlying Si channel and an overlying polysilicon gate. This undesirable property sets a limit on the physical thickness to which a $SiO_2$ layer may be scaled. The minimum thickness due to this monolayer effect is thought to be about 7–8 Å. Therefore, for future devices to have a $t_{eq}$ less than about 10 Å, dielectrics other than $SiO_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that may be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects.

Thus, a reduced $t_{eq}$ for transistors may be realized by using dielectric materials with higher dielectric constants than $SiO_2$. The thinner $t_{eq}$ for lower transistor operating voltages and smaller transistor dimensions may be realized by a significant number of materials, but additional fabricating characteristics makes determining a suitable replacement for $SiO_2$ difficult.

The current view for the microelectronics industry is still for Si based devices. Thus, the gate dielectric employed will grow on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq}=t_{SiO_2}+(\kappa_{ox}/\kappa)t.$$

Thus, if a $SiO_2$ layer is formed in the process, the $t_{eq}$ is again limited by a $SiO_2$ layer.

Thus, use of a ultra-thin silicon oxide interface layer should be limited to significantly less than ten angstroms. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages for using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric may cause variations in the layer's dielectric constant. Many materials having a high dielectric constant relative to $SiO_2$ also have a disadvantage of a crystalline form, at least in a bulk configuration. Thus, the best candidates for replacing $SiO_2$ as a gate dielectric are those with high dielectric constant, a relatively large bandgap, and are able to be fabricated as a thin layer with an amorphous form.

Materials such as $Ta_2O_3$, $TiO_2$, $Al_2O_3$, $ZrO_2$, $ZrSi_xO_y$, $HfSi_xO_y$, and barium strontium titanate (BST) have been proposed as replacements for $SiO_2$ as gate dielectric materials. However, application of such materials may depend on characteristics of a dielectric material useful for application as a gate dielectric that include a sharp interface with a silicon substrate, which favours a low density of interface states, a large bandgap that is comparable to that of silicon oxide, a large energy barrier from the conduction band to the Fermi level of the gate electrode used, and physicochemical and structural stability in subsequent device processing procedures.

Many materials with high dielectric constant have low bandgaps relative to the bandgap of silicon oxide (8.9 eV). The materials $ZrO_2$ and $Al_2O_3$ have dielectric constants of 25 and 9, respectively, and bandgaps of 7.8 eV and 8.7 eV, respectively. See G. D. Wilk et al., *Journal of Applied Physics*, vol. 89: no. 10, pp. 5243–5275 (2001). Thus, a dielectric layer containing $ZrAl_xO_y$ provides a high dielectric constant and large bandgap characteristics. However, other considerations for selecting the material and method for forming a dielectric layer for use in electronic devices and systems concern the suitability of the material for applications requiring that the dielectric layer have an ultra-thin equivalent oxide thickness, form conformally on a substrate, and/or be engineered to specific thickness and elemental concentrations.

Another consideration concerns the roughness of the dielectric layer on a substrate. Surface roughness of the dielectric layer has a significant effect on the electrical properties of the gate oxide, and the resulting operating characteristics of the transistor. Leakage current through a physical 1.0 nm gate oxide has been found to be increased by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High-energy impacts remove body region particles creating pits. The surface of such a deposited layer may have a rough contour due to the rough interface at the body region.

In an embodiment, a $ZrAl_xO_y$ dielectric layer having a substantially smooth surface relative to other processing techniques is formed using atomic layer deposition (ALD). Further, forming a dielectric layer using atomic layer deposition provides for controlling transitions between material layers. Thus, atomic layer deposited $ZrAl_xO_y$ dielectric layers may have an engineered transition with a substrate surface that has an interfacial $SiO_2$ layer or an interfacial silicate layer substantially limited in thickness to provide an effective dielectric constant for the dielectric layer that is significantly greater than that of a silicon oxide layer. Further, the ALD deposited $ZrAl_xO_y$ dielectric layers provide conformal coverage on the surfaces on which they are deposited.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired layer takes place. Subsequent to the layer growth reaction, reaction by-products and precursor excess are purged from the reaction chamber. With favourable precursor chemistry where the precursors adsorb and react with each other on the substrate aggressively, one ALD cycle may be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Thus, ALD provides for controlling layer thickness in a straightforward manner by controlling the number of growth cycles.

ALD was originally developed to manufacture luminescent and dielectric layers needed in electroluminescent displays. Significant efforts have been made to apply ALD to the growth of doped zinc sulfide and alkaline earth metal sulfide layers. Additionally, ALD has been studied for the growth of different epitaxial II–V and II–VI layers, nonepitaxial crystalline or amorphous oxide and nitride layers and multilayer structures of these. There also has been considerable interest towards the ALD growth of silicon and germanium layers, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors may be used though evaporation rates may somewhat vary during the process because of changes in their surface area.

There are several other characteristics for precursors used in ALD. The precursors must be thermally stable at the substrate temperature because their decomposition would destroy the surface control and accordingly the advantages of the ALD method that relies on the reaction of the precursor at the substrate surface. A slight decomposition, if slow compared to the ALD growth, may be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid layer. Additionally, precursors should not react with the layer to cause etching, and precursors should not dissolve in the layer. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, layers can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

The characteristics of RS-ALD include continuity at an interface, conformality over a substrate, use of low temperature and mildly oxidizing processes, freedom from first wafer effects and chamber dependence, growth thickness dependent solely on the number of cycles performed, and ability to engineer multilayer laminate layers with resolution of one to two monolayers. RS-ALD allows for deposition control on the order on monolayers and the ability to deposit monolayers of amorphous layers.

Herein, a sequence refers to the ALD material formation based on an ALD reaction of a precursor or a precursor with its reactant precursor. For example, forming a metal layer from a precursor containing the metal forms an embodiment of a metal sequence. Additionally, forming a layer of metal oxide from a precursor containing the metal and from an oxygen containing precursor as its reactant precursor forms an embodiment of a metal/oxygen sequence, which may be referred to as the metal oxide sequence. A cycle of a metal sequence includes pulsing a precursor containing the metal and pulsing a purging gas for the precursor. Further, a cycle of a metal oxide sequence includes pulsing a precursor containing the metal, pulsing a purging gas for the precursor, pulsing a reactant precursor, and pulsing a purging gas for the reactant precursor. Additionally, a cycle for a compound metal oxide includes pulsing a precursor containing a first metal, pulsing a purging gas for this precursor, pulsing a reactant precursor for the first metal precursor, pulsing a purging gas for the reactant precursor, pulsing a precursor containing a second metal, pulsing a purging gas for this precursor, pulsing a reactant precursor for the second metal precursor, and pulsing a purging gas for this reactant precursor. The order of the metal precursors can depend on the compatibility of the metals with diffusion of atoms through the metal to the underlying substrate. Typically, the order employed limits the amount of unwanted atomic diffusion to the substrate surface.

In an embodiment, a layer of $ZrAl_xO_y$ is formed on a substrate mounted in a reaction chamber by ALD using precursor gases individually pulsed into the reaction chamber. Alternately, solid or liquid precursors may be used in an appropriately designed reaction chamber.

Figure 2A:
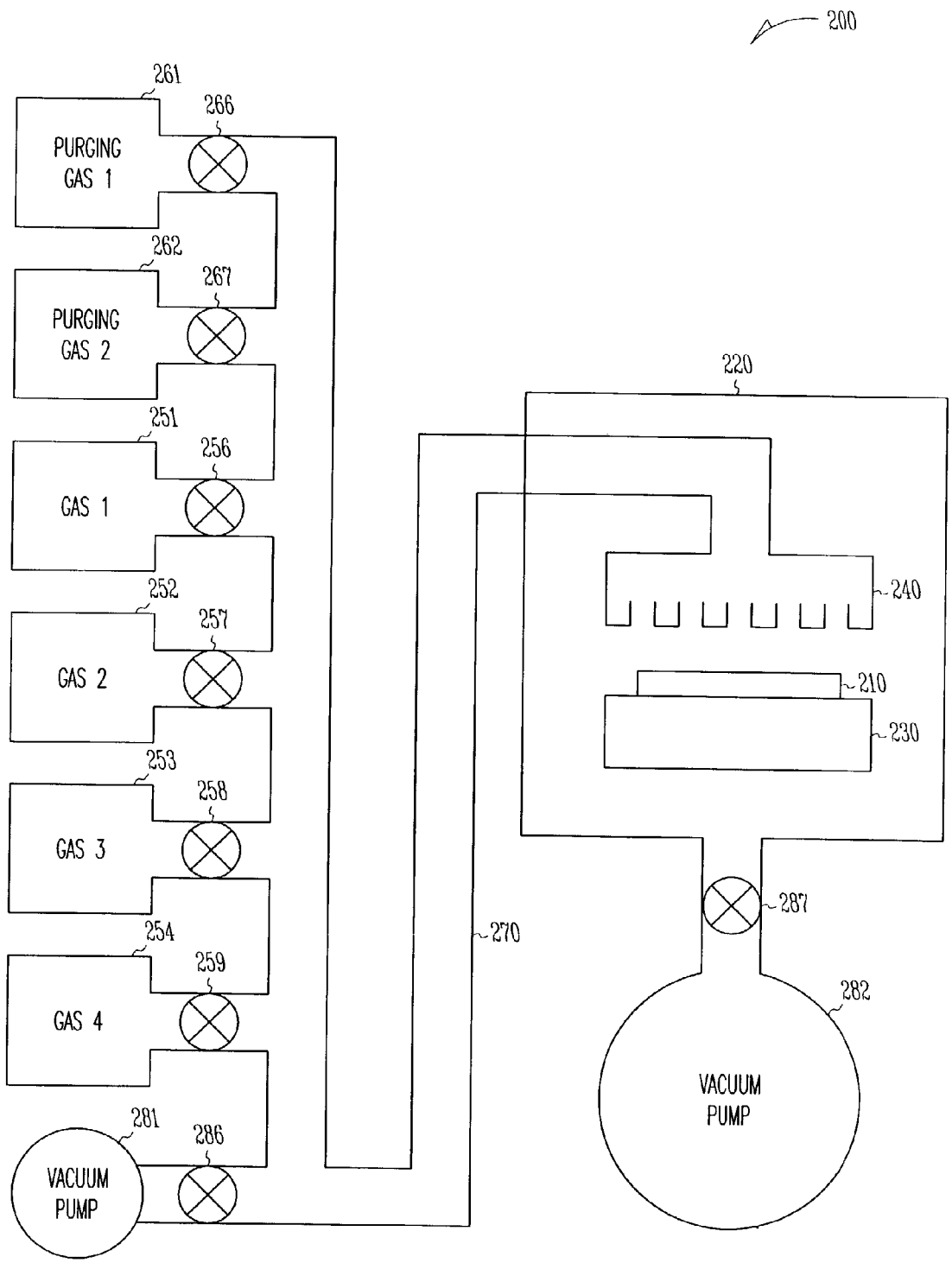
FIG. 2A shows an atomic layer deposition system for processing a dielectric layer containing $ZrAl_xO_y$, according to various embodiments of the present subject matter.

FIG. 2A shows an embodiment of an atomic layer deposition system 200 for processing a dielectric layer containing $ZrAl_xO_y$. The elements depicted are those elements necessary for discussion of embodiments of the present subject matter such that those skilled in the art may practice various embodiments of the present subject matter without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, filed 1 Mar. 2001, incorporated herein by reference.

In FIG. 2A, a substrate 210 is located inside a reaction chamber 220 of ALD system 200. Also located within reaction chamber 220 is a heating element 230, which is thermally coupled to substrate 210 to control the substrate temperature. A gas-distribution fixture 240 introduces precursor gases to the substrate 210. Each precursor gas originates from individual gas sources 251–254 whose flow is controlled by mass-flow controllers 256–259, respectively. Each gas source, 251–254, provides a precursor gas either by storing the precursor as a gas or by providing a location and apparatus for evaporating a solid or liquid material to form the selected precursor gas. Furthermore, additional gas sources may be included, one for each metal precursor employed and one for each reactant precursor associated with each metal precursor.

Also included in the ALD system are purging gas sources 261, 262, each of which is coupled to mass-flow controllers 266, 267, respectively. Furthermore, additional purging gas sources may be constructed in ALD system 200, one purging gas source for each precursor gas. For a process that uses the same purging gas for multiple precursor gases less purging gas sources are used in ALD system 200.

Gas sources 251–254 and purging gas sources 261–262 are coupled by their associated mass-flow controllers to a common gas line or conduit 270, which is coupled to the gas-distribution fixture 240 inside reaction chamber 220.

Gas conduit 270 is also coupled to vacuum pump, or exhaust pump, 281 by mass-flow controller 286 to remove excess precursor gases, purging gases, and by-product gases at the end of a purging sequence from gas conduit 270.

Vacuum pump, or exhaust pump, 282 is coupled by mass-flow controller 287 to remove excess precursor gases, purging gases, and by-product gases at the end of a purging sequence from reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
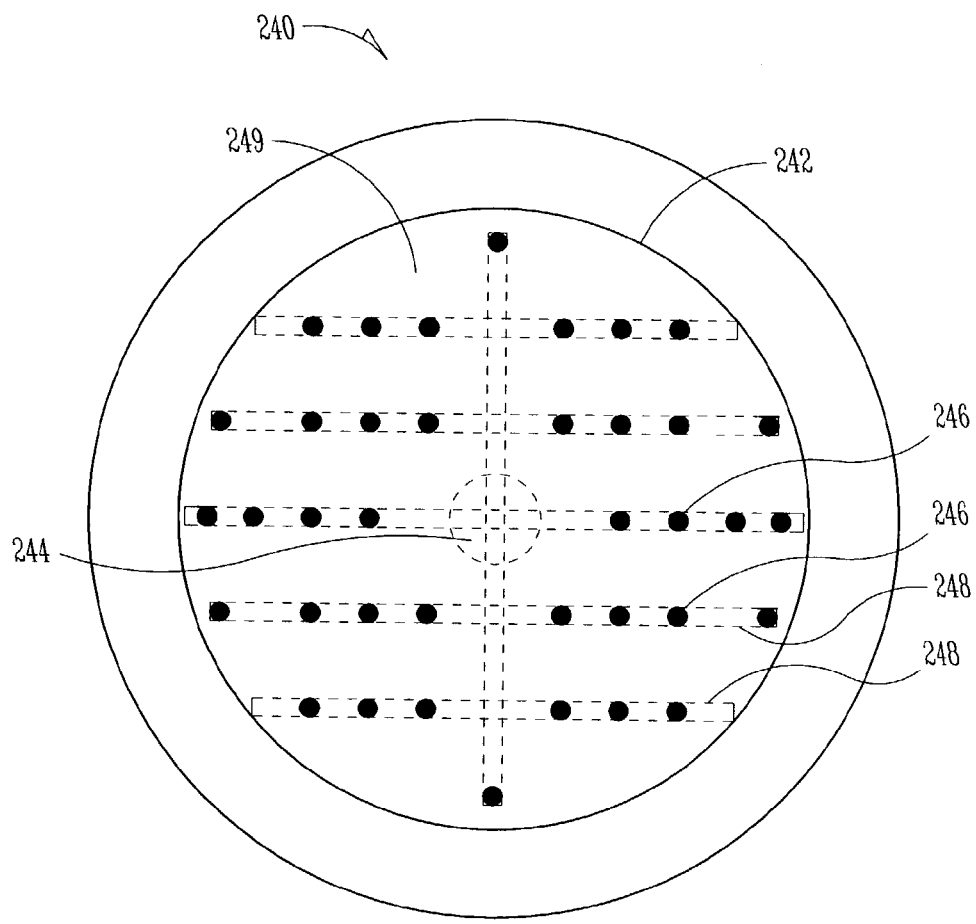
FIG. 2B shows a gas-distribution fixture of an atomic layer deposition system for processing a dielectric layer containing $ZrAl_xO_y$.

FIG. 2B shows an embodiment of a gas-distribution fixture 240 of atomic layer deposition system 200 for processing a dielectric layer containing $ZrAl_xO_y$. Gas-distribution fixture 240 includes a gas-distribution member 242, and a gas inlet 244. Gas inlet 244 couples gas-distribution member 242 to gas conduit 270 of FIG. 2A. Gas-distribution member 242 includes gas-distribution holes, or orifices, 246 and gas-distribution channels 248. In the illustrated embodiment, holes 246 are substantially circular with a common diameter in the range of 15–20 microns, gas-distribution channels 248 have a common width in the range of 20–45 microns. The surface 249 of gas distribution member 242 having gas-distribution holes 246 is substantially planar and parallel to substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing the present subject matter, other ALD systems commercially available may be used.

Those of ordinary skill in the art of semiconductor fabrication understand the use, construction and fundamental operation of reaction chambers for deposition of material layers. Embodiments of the present subject matter may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 200 may be controlled by a computer. To focus on the use of ALD system 200 in the various embodiments of the present subject matter, the computer is not shown. Those skilled in the art can appreciate that the individual elements such as pressure control, temperature control, and gas flow within ALD system 200 may be under computer control. In an embodiment, a computer executes instructions stored in a computer readable medium to accurately control the integrated functioning of the elements of ALD system 200 to form a dielectric layer containing $ZrAl_xO_y$.

Figure 3:
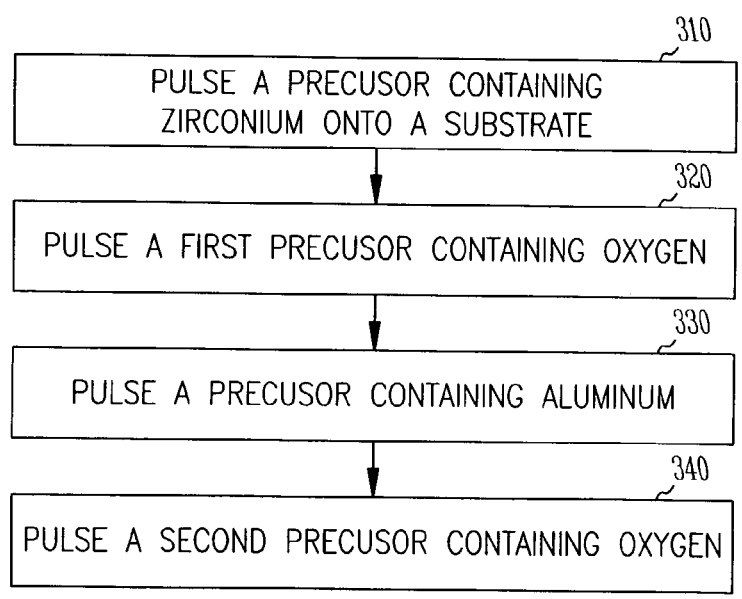
FIG. 3 illustrates a flow diagram of elements for an embodiment of a method to process a $ZrAl_xO_y$ dielectric layer by atomic layer deposition.

FIG. 3 illustrates a flow diagram of elements for an embodiment of a method to process a $ZrAl_xO_y$ dielectric layer by atomic layer deposition. This embodiment to form $ZrAl_xO_y$ by atomic layer deposition includes pulsing a precursor containing zirconium onto a substrate, at block 310, pulsing a first precursor containing oxygen, at block 320, pulsing a precursor containing aluminum, at block 330, and pulsing a second precursor containing oxygen, at block 340. In an embodiment, pulsing a precursor containing zirconium onto a substrate, at block 310 and pulsing a first precursor containing oxygen, at block 320, is performed with a single precursor containing zirconium and oxygen. In an embodiment, pulsing a precursor containing aluminum, at block 330, and pulsing a second precursor containing oxygen, at block 340, is performed with a single precursor containing aluminum and oxygen. In an embodiment, an interface layer formed between the substrate and the $ZrAl_xO_y$ layer is limited to less than about 1 nm (10 angstroms). In an embodiment, the $ZrAl_xO_y$ layer contains $Zr_4AlO_9$. In an embodiment, an interface layer formed between the substrate and the $ZrAl_xO_y$ layer includes silicon oxide or a silicate limited to less than about 1 nm (10 angstroms).

Performing each atomic layer deposition includes pulsing one or more precursors into a reaction chamber for a predetermined period. The predetermined period is individually controlled for each precursor pulsed into the reaction chamber. Further the substrate is maintained at a selected temperature for each pulsing of a precursor, where the selected temperature is set independently for pulsing each precursor. Additionally, each precursor may be pulsed into the reaction under separate environmental conditions. Appropriate temperatures and pressures are maintained dependent on the nature of the precursor, whether the precursor is a single precursor or a mixture of precursors.

Using atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a layer of $ZrAl_xO_y$. Additionally, the reaction chamber may also be purged by evacuating the reaction chamber.

Figure 4:
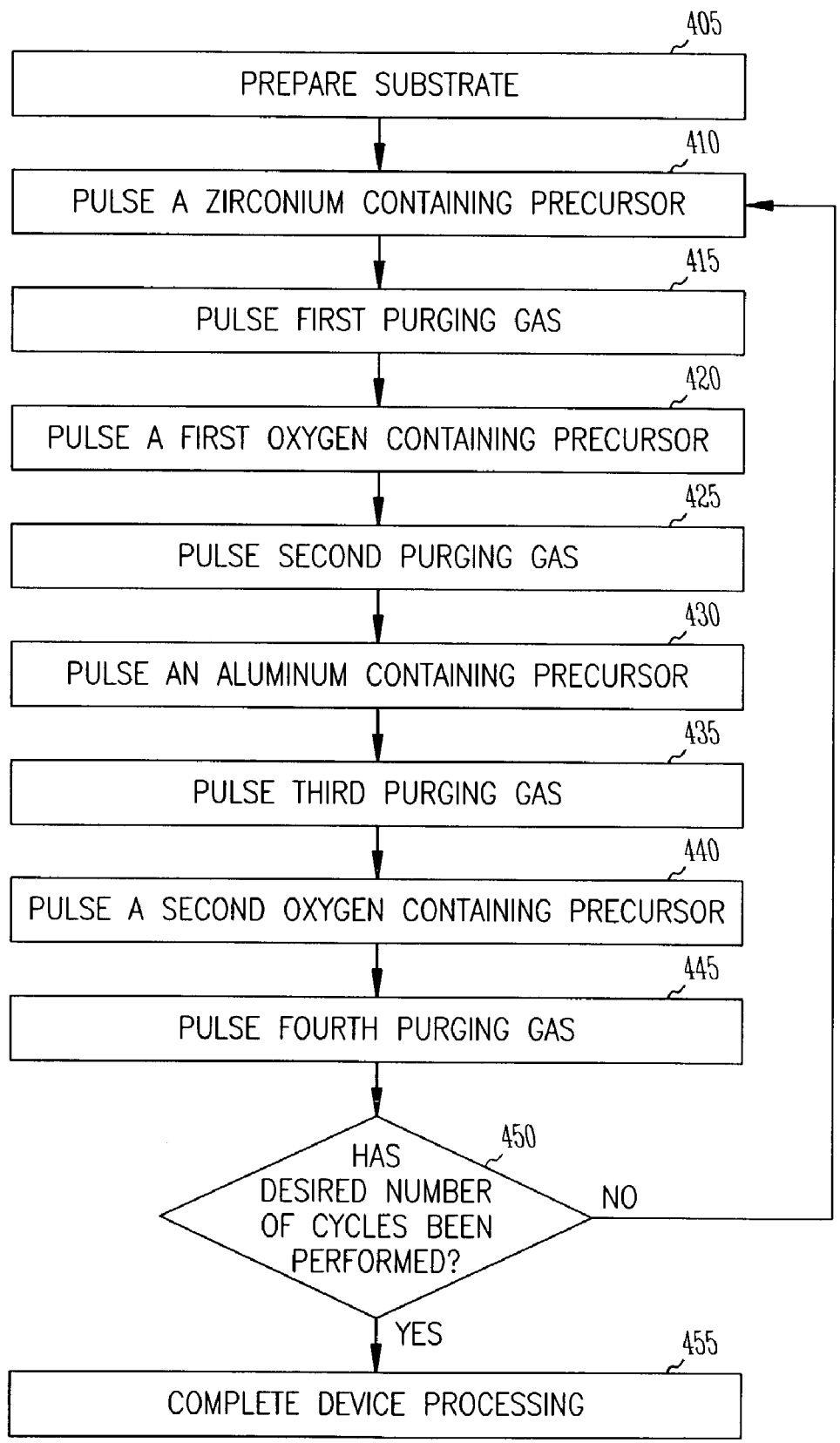
FIG. 4 illustrates a flow diagram of elements for an embodiment of a method to process a dielectric layer containing $ZrAl_xO_y$ by atomic layer deposition.

FIG. 4 illustrates a flow diagram of elements for an embodiment of a method to process a dielectric layer containing $ZrAl_xO_y$ by atomic layer deposition. This embodiment may be implemented with the atomic layer deposition system 200 of FIG. 2A, B.

At block 405, substrate 210 is prepared. The substrate used for forming a transistor is typically a silicon or silicon containing material. In other embodiments, germanium, gallium arsenide, silicon-on-sapphire substrates, or other suitable substrates may be used. This preparation process may include cleaning of substrate 210 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric acid, HF, rinse prior to ALD processing to provide the silicon substrate with a hydrogen-terminated surface without a native silicon oxide layer.

In an embodiment, substrate 210 is prepared as a chemical oxide-terminated silicon surface prior to forming the $ZrAl_xO_y$ dielectric layer by atomic layer deposition. This preparation allows for forming an interface layer of about five angstroms to provide a structure that aids in reducing the leakage current through the dielectric layer.

The sequencing of the formation of the regions of the transistor being processed follows typical sequencing that is generally performed in the fabrication of a MOS transistor as is well known to those skilled in the art. Included in the processing is the masking of substrate regions to be protected during the gate dielectric formation, as is typically performed in MOS fabrication. In this embodiment, the unmasked region may include a body region of a transistor; however one skilled in the art will recognize that other semiconductor device structures may utilize this process.

Additionally, substrate 210 in its ready for processing form is conveyed into a position in reaction chamber 220 for ALD processing.

At block 410, a zirconium-containing precursor is pulsed into reaction chamber 220. In an embodiment, $ZrCl_4$ is used as a precursor. In another embodiment, $ZrI_4$ is used as a precursor. The $ZrCl_4$ precursor is pulsed into reaction chamber 220 through the gas-distribution fixture 240 on substrate 210. Mass-flow controller 256 regulates the flow of the $ZrCl_4$ from gas source 251. In an embodiment, the substrate temperature is maintained at about 180° C. In another embodiment, the substrate temperature is maintained between about 300° C. and about 500° C. The $ZrCl_4$ reacts with the surface of the substrate 210 in the desired region defined by the unmasked areas of the substrate 210.

At block 415, a first purging gas is pulsed into reaction chamber 220. In an embodiment, nitrogen with a purity of about 99.999% is used as a purging gas. Mass-flow controller 266 regulates the nitrogen flow from the purging gas source 261 into the gas conduit 270. Using the pure nitrogen purge avoids overlap of the precursor pulses and possible gas phase reactions.

A first oxygen-containing precursor is pulsed onto substrate 210, at block 420. In an embodiment, water vapor ($H_2O$) is used as a precursor. In another embodiment, $H_2O_2$ is used as a precursor. In another embodiment, an $H_2O$—$H_2O_2$ mixture is used as a precursor. The water vapor precursor is pulsed into reaction chamber 220 through the gas-distribution fixture 240 on substrate 210. Mass-flow controller 257 regulates the flow of the water vapor from gas source 252. In an embodiment, the substrate temperature is maintained at about 180° C. In another embodiment, the substrate temperature is maintained between about 300° C. and about 500° C. The water vapor reacts with at the surface of substrate 210 in the desired region defined by the unmasked areas of the substrate 210.

After pulsing the first oxygen-containing precursor, a second purging gas is pulsed, at block, 425. In an embodiment, nitrogen is used as the second purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286.

In an embodiment using a $ZrCl_4/H_2O$ vapor sequence, the substrate is held between about 300° C. and about 500° C. by the heating element 230. The $ZrCl_4$ pulse time ranges from about 0.2 sec to above 1.0 sec. After the $ZrCL_4$ pulse, the zirconium/water vapor sequence continues with a purge pulse followed by a $H_2O$ pulse followed by a purge pulse. In an embodiment, the $H_2O$ vapor pulse time may range from about 0.2 sec to above 1.0 sec, and the $ZrCl_4$ and the $H_2O$ vapor purging pulse times are each range from about 0.2 sec to about 4.0 sec.

In an embodiment using a $ZrI_4/H_2O$—$H_2O_2$ vapor sequence, the substrate is held between about 230° C. and about 500° C. by the heating element 230 with reaction chamber 220 held at about 250 Pa. In an embodiment, the $ZrI_4$ pulse time is about 2.0 sec. After the $ZrI_4$ pulse, the $ZrI_4/H_2O$—$H_2O_2$ vapor sequence continues with a purge pulse followed by an $H_2O$—$H_2O_2$ vapor pulse followed by a purge pulse. In an embodiment, the $H_2O$—$H_2O_2$ vapor pulse time is about 2.0 sec, and the $ZrI_4$ and the $H_2O$—$H_2O_2$ vapor purging pulse times are each at about 2.0 sec.

After pulsing the second purging gas, an aluminum-containing precursor is pulsed into reaction chamber 220, at block 430. In an embodiment, the aluminum-containing precursor is trimethylaluminum (TMA), $Al(CH_3)_3$. In another embodiment, the aluminum-containing precursor is DMEAA, an adduct of alane ($AlH_3$) and dimethylehtylamine $\{N(CH_3)_2(C_2H_5)\}$. The trimethylaluminum precursor is pulsed into reaction chamber 220 through the gas-distribution fixture 240 on substrate 210. Mass-flow controller 258 regulates the flow of the trimethylaluminum from gas source 253. In an embodiment, the substrate temperature is maintained between about 300° C. and about 500° C. The trimethylaluminum aggressively reacts at the current surface of substrate 210.

At block 435, a third purging gas is introduced into the system. Nitrogen gas may also be used as a purging and carrier gas. The nitrogen flow is controlled by mass-flow controller 267 from the purging gas source 262 into the gas conduit 270 and subsequently into reaction chamber 220. In another embodiment, argon gas may be used as the purging gas.

A second oxygen-containing precursor is pulsed on substrate 210, at block 440. In an embodiment, water vapor ($H_2O$) is used as a precursor. In another embodiment, $H_2O_2$ is used as a precursor. In another embodiment, an $H_2O$—$H_2O_2$ mixture is used as a precursor. The water vapor precursor is pulsed into reaction chamber 220 through the gas-distribution fixture 240 on substrate 210. Mass-flow controller 259 regulates the flow of the water vapor from gas source 254. The water vapor reacts aggressively at the current surface of substrate 210.

After pulsing the second oxygen-containing precursor, a fourth purging gas is pulsed, at block, 445. In an embodiment, nitrogen is used as the second purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286. With the conclusion of the fourth purging gas pulse, a cycle forming atomic layer deposited $ZrAl_xO_y$ is completed.

During the TMA/water vapor sequence, the substrate is held between about 350° C. and about 450° C. by the heating element 230. The process pressure is maintained at about 230 mTorr during the pulsing of the precursor gases and at about 200 mTorr for the purging gases. Pulse times for the TMA and the water vapor were about 1 sec for both precursors, with purging pulse times of about 15 s.

As an alternate aluminum sequence, a DMEAA/oxygen sequence can be employed rather than the TMA/water vapor sequence with the substrate held between about 100° C. and about 125° C. by the heating element 230. In an embodiment, the substrate is held at about 350° C. during the DMEAA/oxygen sequence. The process pressure during the DMEAA/oxygen sequence is maintained at about 30 mTorr.

At block 450, a determination is made as to whether a desired number of cycles has been performed, that is, whether the number of completed cycles is equal to a predetermined number. The predetermined number corresponds to a predetermined thickness for the ALD $ZrAl_xO_y$ dielectric layer. If the number of completed cycles is less than the predetermined number, the zirconium-containing precursor is pulsed into reaction chamber 220, at block 410, and the process continues. If the total number of cycles to form the desired thickness has been completed, the dielectric layer containing $ZrAl_xO_y$ may be annealed. To avoid the diffusion of oxygen during annealing to the semiconductor substrate surface, any annealing may be performed in an oxygen-free environment for short periods of time. An embodiment of an annealing environment may include a nitrogen atmosphere. In addition to limiting or avoiding oxygen diffusion to the semiconductor substrate, the relatively low temperatures employed by atomic layer deposition of a $ZrAl_xO_y$ dielectric layer allows for the formation of an amorphous $ZrAl_xO_y$ dielectric layer.

The thickness of a $ZrAl_xO_y$ layer is determined by a fixed growth rate for the pulsing periods and precursors used, set at a value such as N nm/cycle. For a desired $ZrAl_xO_y$ layer thickness, t, in an application such as forming a gate dielectric of a MOS transistor, the ALD process is repeated for t/N total cycles. Once the t/N cycles have completed, no further ALD processing for $ZrAl_xO_y$ is performed. In an embodiment, ALD processing provides for the engineering of a dielectric layer containing $ZrAl_xO_y$ having a dielectric constant in the range from about 9 to about 25.

At block 455, after forming the $ZrAl_xO_y$, processing the device having the dielectric layer containing $ZrAl_xO_y$ is completed. In an embodiment, completing the device includes completing the formation of a transistor. In an embodiment, completing the device includes completing the formation of a capacitor. Alternately, completing the process includes completing the construction of a memory device having an array with access transistors formed with gate dielectrics containing atomic layer deposited $ZrAl_xO_y$. In an embodiment, completing the process includes the formation of an electronic system including an information handling device that uses electronic devices with transistors formed with dielectric layers containing atomic layer deposited $ZrAl_xO_y$. Typically, information handling devices such as computers include many memory devices, having many access transistors.

Upon reading and comprehending this disclosure, it can be appreciated by those skilled in the art that the elements of a method for forming an atomic layer deposited $ZrAl_xO_y$ layer in the embodiment of FIG. 4 may be performed under various other environmental conditions, including various pressures and temperatures, and pulse periods depending on the $ZrAl_xO_y$ layer to be formed for a given application and the system used to fabricate the $ZrAl_xO_y$ layer. Determination of the environmental conditions, precursors used, purging gases employed, and pulse periods for the precursors and purging gases may be made without undue experimentation.

Atomic layer deposition of a $ZrAl_xO_y$ dielectric layer may be processed in an atomic layer deposition system such as ALD system 200 under computer control to perform various embodiments, and operated under computer-executable instructions to perform these embodiments. In an embodiment, a computerized method and the computer-executable instructions for a method for forming a $ZrAl_xO_y$ dielectric layer by atomic layer deposition includes pulsing a precursor containing zirconium onto a substrate, pulsing a first precursor containing oxygen, pulsing a precursor containing aluminum, and pulsing a second precursor containing oxygen. In an embodiment, pulsing the precursor containing zirconium and pulsing the first precursor containing oxygen includes pulsing a precursor containing both zirconium and oxygen in one pulsing process. In an embodiment, pulsing the precursor containing aluminum and pulsing the second precursor containing oxygen includes pulsing a precursor containing both aluminum and oxygen in one pulsing process.

In an embodiment, a computerized method and the computer-executable instructions for a method for forming a $ZrAl_xO_y$ dielectric layer include forming the $ZrAl_xO_y$ dielectric layer by atomic layer deposition, where each precursor is pulsed into a reaction chamber for a predetermined period. The predetermined period is individually controlled for each precursor pulsed into the reaction chamber. Further, the substrate may be maintained at a selected temperature for each pulsing of a precursor, where the selected temperature is set independently for pulsing each precursor. In addition, each pulsing of a precursor is followed by purging the reaction chamber with a purging gas.

In an embodiment, a computerized method and the computer-executable instructions for a method for forming a dielectric layer include regulating the deposition of zirconium, aluminum, and oxygen to form a dielectric layer having a dielectric constant in the range from about 9 to about 25.

In an embodiment, a computerized method and the computer-executable instructions for a method for forming a dielectric layer containing $ZrAl_xO_y$ include controlling an environment of a reaction chamber. Additionally, the computerized method controls the pulsing of purging gases, one for each precursor gas and pulsing each purging gas after pulsing the associated precursor gas. Using a computer to control parameters for growing the $ZrAl_xO_y$ dielectric layer provides for processing the $ZrAl_xO_y$ dielectric layer over a wide range of parameters allowing for the determination of an optimum parameter set for the ALD system used. The computer-executable instructions may be provided in any computer-readable medium. Such computer-readable medium may include, but is not limited to, floppy disks, diskettes, hard disks, CD-ROMS, flash ROMS, nonvolatile ROM, and RAM.

An embodiment of this method may be realized using ALD system 200 of FIG. 2A, where the controls for the individual elements of ALD system 200 are coupled to a computer, not shown in FIG. 2A. The computer provides control of the operation for processing a $ZrAl_xO_y$ dielectric layer by regulating the flow of precursor gases into reaction chamber 220. The computer controls the flow rate of precursor gases and the pulsing periods for these gases by controlling mass-flow controllers 256–259. Additionally, the computer controls the temperature of gas sources 251–254. Further, the pulse period and flow of purging gases from purging gas sources 261, 262 is regulated through computer control of mass-flow controllers 266, 267, respectively.

The computer also regulates the environment of reactor chamber 220 in which a dielectric layer is being formed on substrate 210. The computer regulates the pressure in reaction chamber 220 within a predetermined pressure range by controlling vacuum pumps 281, 282 through mass-flow controllers 286, 287, respectively. The computer also regulates the temperature range for substrate 210 within a predetermined range by controlling heater 230.

For convenience, the individual control lines to elements of ALD 200, as well as a computer, are not shown in FIG. 2A. The above description of the computer control in conjunction with FIG. 2A provides information for those skilled in the art to practice embodiments for forming a dielectric layer containing $ZrAl_xO_y$ using a computerized method as described herein.

The embodiments described herein provide a process for growing a $ZrAl_xO_y$ dieletric layer having a wide range of useful equivalent oxide thickness, $t_{eq}$, associated with a dielectric constant in the range from about 9 to about 25. The $t_{eq}$ range in accordance with embodiments of the present subject matter are shown in the following:

| | Physical Thickness t = 1.0 nm (10 Å) | Physical Thickness t = 2.0 nm (20 Å) | Physical Thickness t = 5.0 nm (50 Å) | Physical Thickness t = 10.0 nm (100 Å) |
|---|---|---|---|---|
| κ | $t_{eq}$ (Å) | $t_{eq}$ (Å) | $t_{eq}$ (Å) | $t_{eq}$ (Å) |
| 9 | 4.33 | 8.67 | 21.67 | 43.33 |
| 12 | 3.25 | 6.50 | 16.25 | 32.50 |
| 15 | 2.60 | 5.20 | 13.00 | 26.00 |
| 20 | 1.95 | 3.90 | 9.75 | 19.50 |
| 25 | 1.56 | 3.12 | 7.80 | 15.60 |

The relatively large dielectric constant for $ZrAl_xO_y$ layers allows for the engineering of dielectric layers having a physical thickness in the 10 nm (100 Å) range, while achieving a $t_{eq}$ of less than 5 nm (50 Å). From above, it is apparent that a layer containing $ZrAl_xO_y$ may be attained with a $t_{eq}$ ranging from about 1.5 Å to about 9 Å. Further, an atomic layer deposited $ZrAl_xO_y$ layer may provide a $t_{eq}$ significantly less than 2 or 3 Å, even less than 1.5 Å.

Attainment of a $t_{eq}$ in the thickness range of one to a several monolayers is associated with an interfacial layer between a semiconductor substrate surface and the $ZrAl_xO_y$ dielectric layer that is exceptionally small or composed of a material having a dielectric constant approaching that of the $ZrAl_xO_y$ value. To obtain the smallest possible $t_{eq}$, the formation of a $SiO_2$ interfacial layer should be avoided. However, having a silicon oxide layer or a silicate layer between the substrate and the $ZrAl_xO_y$ layer can aid in the reduction of leakage current. In an embodiment, an interfacial layer of silicon oxide or a silicate is limited to about 5 angstroms. In an embodiment, other materials can be used to form an interfacial layer between the substrate and the $ZrAl_xO_y$ layer. Such an interfacial layer aids in providing a low density of electronic states at the substrate interface, in reducing leakage current, and in providing a diffusion barrier depending on the material forming the interfacial layer. In an embodiment, the interfacial layer is limited to less than about 1 nm (10 Å). However, an interfacial layer of material having a dielectric constant less than that of the $ZrAl_xO_y$ layer formed reduces the overall dielectric constant of the effective dielectric layer containing the $ZrAl_xO_y$ layer and the interfacial layer.

Dielectric layers containing $ZrAl_xO_y$ using embodiments of the present subject matter may be engineered with various structures and compositions including an amorphous structure with an approximate average composition $Zr_4AlO_9$, a uniform distribution of the elements of the oxide through the film with an abrupt interface with a silicon substrate, a dielectric material whose properties are similar to a double oxide, Zr—O and Al—O, without $ZrO_2$—$AL_2O_3$ present in the dielectric layer, and/or a thin silicon oxide or a silicate interface layer with a thickness significantly less than 1 nm (10 Å).

Any micro-roughness associated with thin layers of $ZrAl_xO_y$ may be due to partial monolayer formation of the dielectric layer across the substrate surface. With some areas of the dielectric layer forming a monolayer in two or three cycles, while another area or region of the layer forms a monolayer in one or two cycles, the surface of the $ZrAl_xO_y$ dielectric layer may exhibit some micro-roughness. As can be understood by those skilled in the art, particular growth rates and processing conditions for providing a $ZrAl_xO_y$ dielectric layer with reduced or substantially eliminated micro-roughness may be determined during normal initial testing of the ALD system for processing a $ZrAl_xO_y$ dielectric layer for a given application without undue experimentation.

Further, $ZrAl_xO_y$ dielectric layers formed by atomic layer deposition may provide not only ultra thin $t_{eq}$ layers, but also layers with relatively low leakage current. In addition to using ALD to provide precisely engineered layer thicknesses with engineered dielectric constants, good breakdown electric field properties, and relatively low leakage currents, ALD processing provides for dielectric layers that provide conformal layering on selected substrate surfaces.

Embodiments of processes described above for performing atomic layer deposition of $ZrAl_xO_y$ are used to precisely control the thickness of the dielectric layer formed, where, in addition to providing an ultra thin $t_{eq}$, the atomic layer deposition process provides for relatively smooth surfaces and limited interfacial layer formation. Additionally, these embodiments for ALD processing of $ZrAl_xO_y$ dielectric layers may be implemented to form transistors, capacitors, memory devices, and other electronic systems including electro-optic devices, microwave devices, and information handling devices. With careful preparation and engineering of the $ZrAl_xO_y$ layer, limiting the size of interfacial regions, a teq less than about 10 Å for these devices is anticipated.

A transistor 100 as depicted in FIG. 1 may be constructed by forming a source region 120 and a drain region 130 in a silicon based substrate 110 where source and drain regions 120, 130 are separated by a body region 132. Body region 132 defines a channel having a channel length 134. A dielectric layer is disposed on substrate 110 formed as a layer containing $ZrAl_xO_y$ by atomic layer deposition. The resulting $ZrAl_xO_y$ dielectric layer forms gate dielectric 140.

A gate 150 is formed over gate dielectric 140. Typically, forming gate 150 may include forming a polysilicon layer, though a metal gate may be formed in an alternative process. An interfacial layer 133 formed between gate dielectric 140 and body region 132 is limited to a thickness less than 1 nm (10 Å). In an embodiment, interfacial layer 133 is eliminated or reduced to a thickness that can not be measured or determined to have a significant effect on the dielectric constant of the region between gate 150 and body region 132. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 5A:
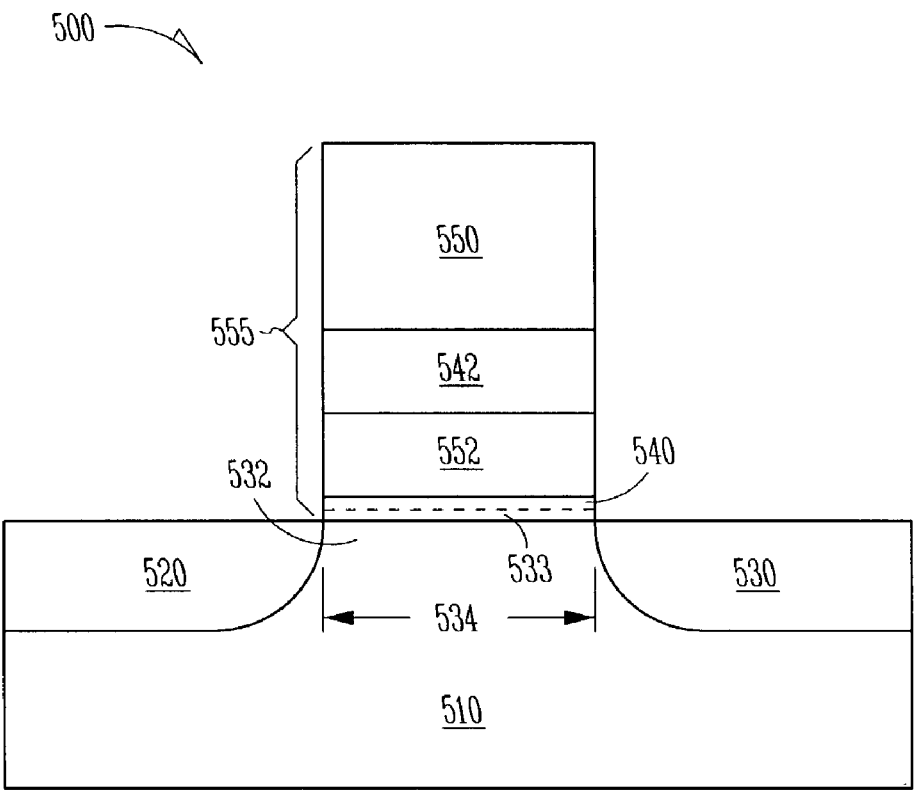
FIG. 5A shows an embodiment of a configuration of a transistor having an atomic layer deposited $ZrAl_xO_y$ dielectric layer.

The method for forming an atomic layer deposited $ZrAl_xO_y$ in various embodiments may be applied to other transistor structures having dielectric layers. FIG. 5A shows an embodiment of a configuration of a transistor 500 having an atomic layer deposited $ZrAl_xO_y$ dielectric layer. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. Gate dielectric 540 may be formed containing atomic layer deposited $ZrAl_xO_y$ described above with the remaining elements of the transistor 500 formed using processes known to those skilled in the art. Alternately, both gate dielectric 540 and floating gate dielectric 542 may be formed as dielectric layers containing $ZrAl_xO_y$ in various embodiments as described herein. An interfacial layer 533 formed between gate dielectric 540 and body region 532 is limited to a thickness less than 1 nm (10 Å).

In an embodiment, interfacial layer 533 is eliminated or reduced to a thickness that can not be measured or determined to have a significant effect on the dielectric constant of the region between floating gate 552 and body region 532. In an embodiment with floating gate dielectric 542 formed containing $ZrAl_xO_y$, an interfacial layer between floating gate dielectric 542 and floating gate 552 is limited to less than 1 nm (10 Å) or effectively eliminated.

Figure 5B:
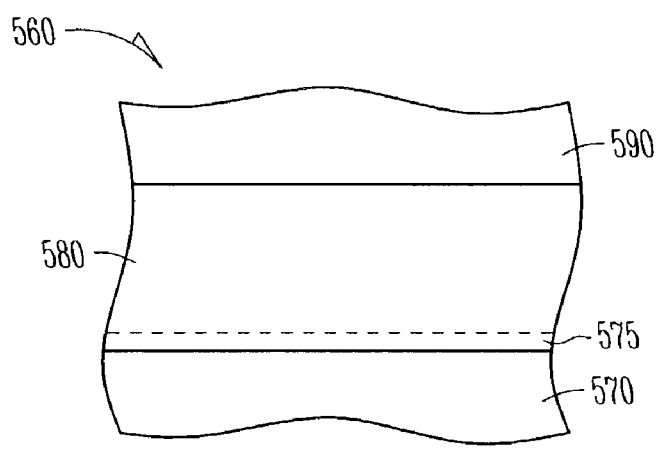
FIG. 5B shows an embodiment of a configuration of a capacitor having an atomic layer deposited $ZrAl_xO_y$ dielectric layer.

The embodiments of methods for forming $ZrAl_xO_y$ dielectric layers may also be applied to forming capacitors in various integrated circuits, memory devices, and electronic systems. In an embodiment for forming a capacitor 560 illustrated in FIG. 5B, a method includes forming a first conductive layer 570, forming a dielectric layer 580 containing $ZrAl_xO_y$ on first conductive layer 570 by atomic layer deposition, and forming a second conductive layer 590 on dielectric layer 580. An interfacial layer 575 formed between dielectric layer 580 and first conductive layer 570 is limited to a thickness less than 1 nm (10 Å). In an embodiment, interfacial layer 575 is eliminated or reduced to a thickness that can not be measured or determined to have a significant effect on the dielectric constant of the region between first conductive layer 570 and second conductive layer 590. ALD formation of the $ZrAl_xO_y$ dielectric layer allows the dielectric layer to be engineered within a predetermined composition providing a desired dielectric constant.

Figure 6:
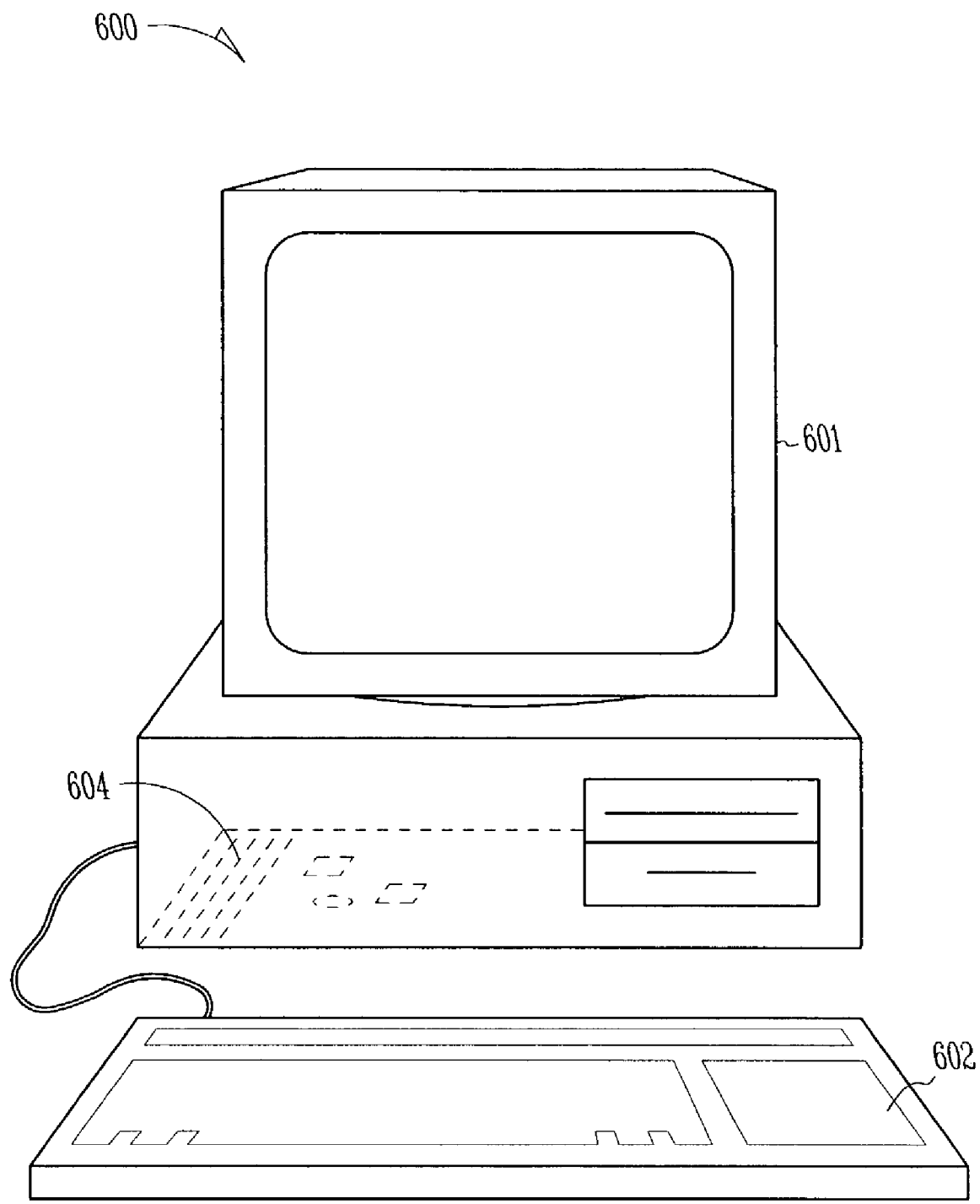
FIG. 6 shows an embodiment of a personal computer incorporating devices having an atomic layer deposited $ZrAl_xO_y$ dielectric layer.
Figure 7:
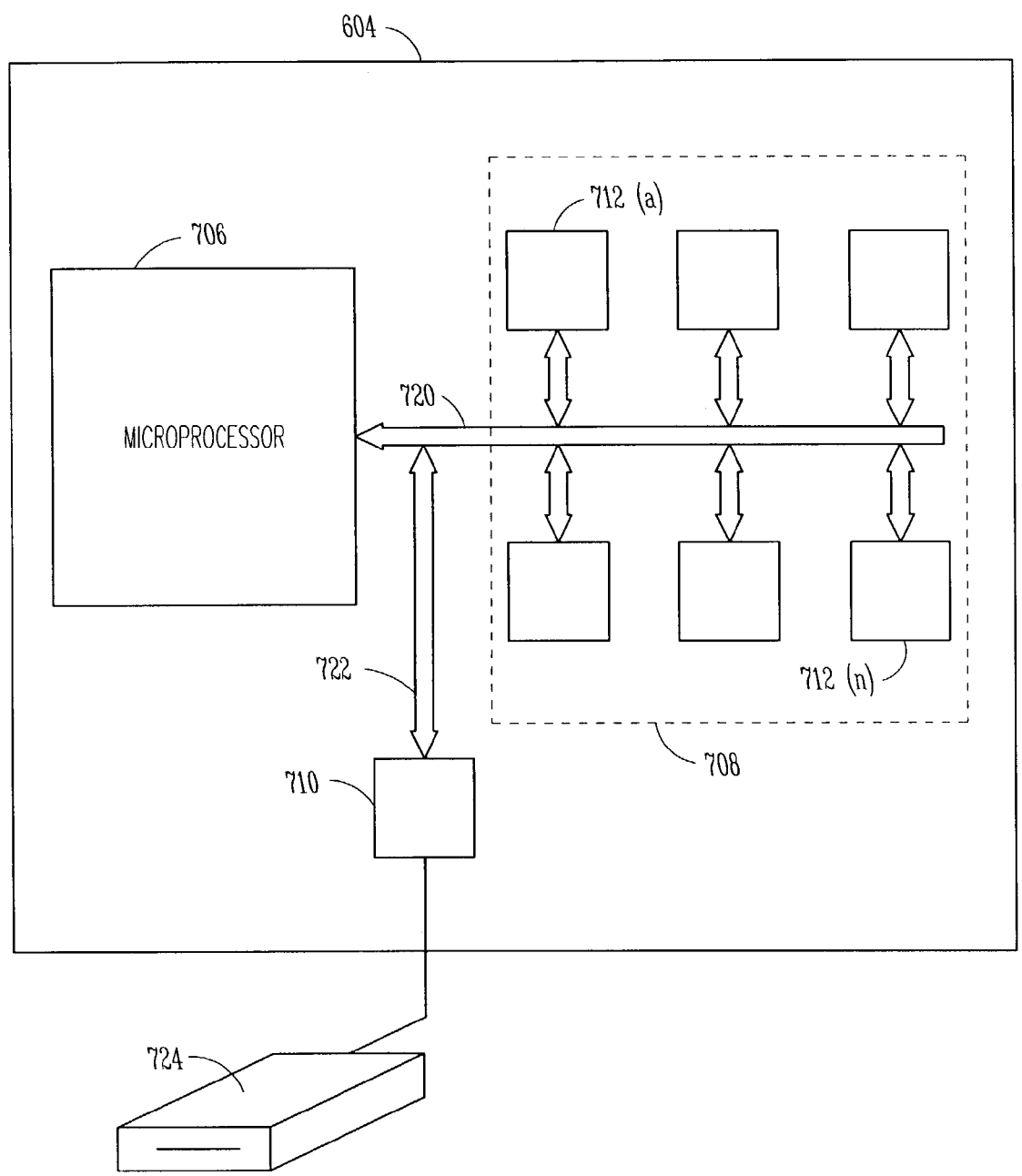
FIG. 7 illustrates a schematic view of an embodiment of a central processing unit incorporating devices having an atomic layer deposited $ZrAl_xO_y$ dielectric layer.
Figure 8:
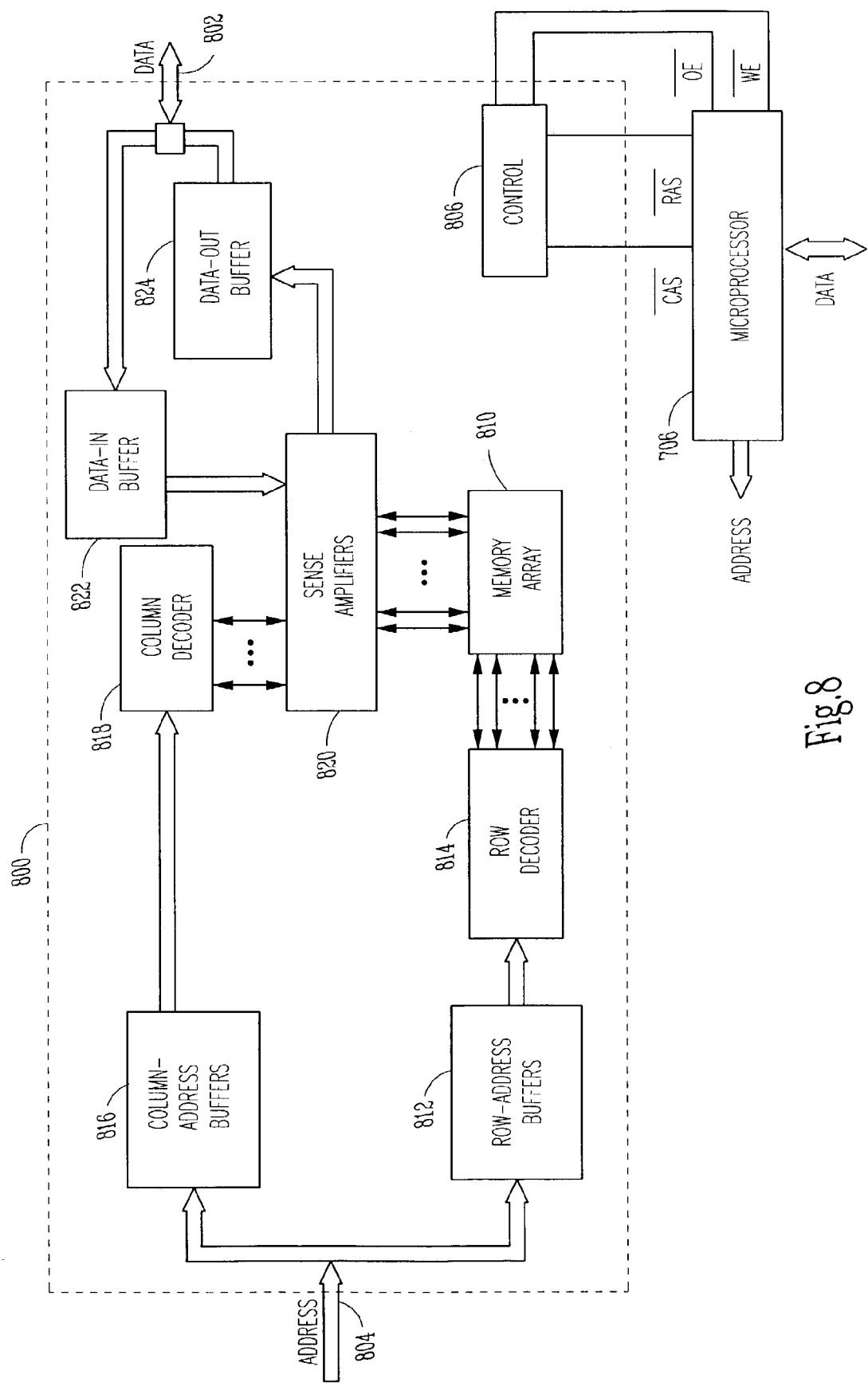
FIG. 8 illustrates a schematic view of an embodiment of a DRAM memory device having an atomic layer deposited $ZrAl_xO_y$ dielectric layer.

Transistors, capacitors, and other devices having $ZrAl_xO_y$ dielectric layers formed by atomic layer deposition using methods described herein may be implemented into memory devices and electronic systems including information handling devices. Such information devices may include wireless systems, telecommunication systems, and computers. An embodiment of a computer having a $ZrAl_xO_y$ dielectric layer formed by atomic layer deposition using methods described herein is shown in FIGS. 6–8 and described below. While specific types of memory devices and computing devices are shown below, it will be recognized by one skilled in the art that several types of memory devices and electronic systems including information handling devices utilize the present subject matter.

A personal computer 600, as shown in FIGS. 6 and 7, includes a monitor 601, keyboard input 602, and a central processing unit 604. Central processor unit 604 typically includes microprocessor 706, memory bus circuit 708 having a plurality of memory slots 712(a–n), and other peripheral circuitry 710. Peripheral circuitry 710 permits various peripheral devices 724 to interface processor-memory bus 720 over input/output (I/O) bus 722. The personal computer shown in FIGS. 6 and 7 also includes at least one transistor having a $ZrAl_xO_y$ dielectric layer formed by atomic layer deposition using methods described herein according to an embodiment of the present subject matter.

Microprocessor 706 produces control and address signals to control the exchange of data between memory bus circuit 708 and microprocessor 706 and between memory bus circuit 708 and peripheral circuitry 710. This exchange of data is accomplished over high speed memory bus 720 and over high speed I/O bus 722.

Coupled to memory bus 720 are pluralities of memory slots 712(a–n), which receive memory devices well known to those skilled in the art. For example, single in-line memory modules (SIMMs) and dual in-line memory modules (DIMMs) may be used in the implementation of an embodiment of the present subject matter.

These memory devices may be produced in a variety of designs that provide different methods of reading from and writing to the dynamic memory cells of memory slots 712. One such method is the page mode operation. Page mode operations in a DRAM are defined by the method of accessing a row of a memory cell arrays and randomly accessing different columns of the array. Data stored at the row and column intersection may be read and output while that column is accessed. Page mode DRAMs use access steps, which limit the communication speed of memory circuit 708.

An alternate type of device is the extended data output (EDO) memory, which allows data stored at a memory array address to be available as output after the addressed column has been closed. This memory may increase some communication speeds by allowing shorter access signals without reducing the time in which memory output data is available on memory bus 720. Other alternative types of devices include SDRAM, DDR SDRAM, SLDRAM and Direct RDRAM as well as others such as SRAM or Flash memories.

FIG. 8 illustrates a schematic view of an embodiment of a DRAM memory device 800 having an atomic layer deposited $ZrAl_xO_y$ dielectric layer formed according to an embodiment described herein. Illustrative DRAM memory device 800 is compatible with memory slots 712(a–n). The description of DRAM memory device 800 has been simplified for purposes of illustrating a DRAM memory device and is not intended to be a complete description of all the features of a DRAM. Those skilled in the art will recognize that a wide variety of memory devices may be used in the implementation of embodiments of the present subject matter. The embodiment of a DRAM memory device shown in FIG. 8 includes at least one transistor having a $ZrAl_xO_y$ dielectric layer formed by atomic layer deposition using methods described herein according to the teachings of the present subject matter.

Control, address and data information provided over memory bus 720 is further represented by individual inputs to DRAM 800, as shown in FIG. 8. These individual representations are illustrated by data lines 802, address lines 804 and various discrete lines directed to control logic 806.

As is well known in the art, DRAM 800 includes memory array 810, which in turn comprises rows and columns of addressable memory cells. Each memory cell in a row is coupled to a common word line. The word line is coupled to gates of individual transistors, where at least one transistor has a gate coupled to a gate dielectric containing $ZrAl_xO_y$ formed by atomic layer deposition in accordance with the method and structure previously described above. Additionally, each memory cell in a column is coupled to a common bit line. Each cell in memory array 810 may include a storage capacitor and an access transistor as is conventional in the art.

DRAM 800 interfaces with, for example, microprocessor 706 through address lines 804 and data lines 802. Alternatively, DRAM 800 may interface with a DRAM controller, a micro-controller, a chip set or other electronic system. Microprocessor 706 also provides a number of control signals to DRAM 800, including but not limited to, row and column address strobe signals RAS and CAS, write enable signal WE, an output enable signal OE and other conventional control signals.

Row address buffer 812 and row decoder 814 receive and decode row addresses from row address signals provided on address lines 804 by microprocessor 706. Each unique row address corresponds to a row of cells in memory array 810. Row decoder 814 may include a word line driver, an address decoder tree, and circuitry which translates a given row address received from row address buffers 812 and selectively activates the appropriate word line of memory array 810 via the word line drivers.

Column address buffer 816 and column decoder 818 receive and decode column address signals provided on address lines 804. Column decoder 818 also determines when a column is defective and the address of a replacement column.

Column decoder 818 is coupled to sense amplifiers 820. Sense amplifiers 820 are coupled to complementary pairs of bit lines of memory array 810.

Sense amplifiers 820 are coupled to data-in buffer 822 and data-out buffer 824. Data-in buffers 822 and data-out buffers 824 are coupled to data lines 802. During a write operation, data lines 802 provide data to data-in buffer 822. Sense amplifier 820 receives data from data-in buffer 822 and stores the data in memory array 810 as a charge on a capacitor of a cell at an address specified on address lines 804.

During a read operation, DRAM 800 transfers data to microprocessor 706 from memory array 810. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 820 detects and amplifies a difference in voltage between the complementary bit lines. The sense amplifier passes the amplified voltage to data-out buffer 824.

Control logic 806 is used to control the many available functions of DRAM 800. In addition, various control circuits and signals not detailed herein initiate and synchronize DRAM 800 operation as known to those skilled in the art. As stated above, the description of DRAM 800 has been simplified for purposes of illustrating an embodiment of the present subject matter and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present subject matter. The DRAM implementation described herein is illustrative only and not intended to be exclusive or limiting.

CONCLUSION

A $ZrAl_xO_y$ dielectric layer, formed by atomic layer deposition using methods described herein, provides a reliable dielectric layer having an equivalent oxide thickness thinner than attainable using $SiO_2$. Dielectric layers containing atomic layer deposited $ZrAl_xO_y$ formed using the methods described herein are thermodynamically stable such that the dielectric layers formed will have minimal reactions with a silicon substrate or other structures during processing.

Forming $ZrAl_xO_y$ layers by atomic layer deposition in relatively low processing temperatures allows for $ZrAl_xO_y$ layers that are amorphous and conformally layered on a substrate surface. Further, the ALD formation of a $ZrAl_xO_y$ dielectric layer provides for enhanced dielectric and electrical properties relative to those attained with an amorphous $SiO_x$ layer. Additionally, embodiments for the ALD processing of $ZrAl_xO_y$ layers provide for the formation of interfacial layers between a substrate and a $ZrAl_xO_y$ layer that is limited to less than about 1 nm (Å), where the interfacial layer aids in providing a low density of electronic states at the substrate interface, in reducing leakage current, and in providing a diffusion barrier depending on the material forming the interfacial layer. These properties of $ZrAl_xO_y$ dielectric layers allow for application as dielectric layers in numerous devices and systems.

Capacitors, transistors, electro-optic devices, higher level ICs or devices, and electronic systems are constructed utilizing various embodiments of the process for forming a $ZrAl_xO_y$ dielectric layer having an ultra thin equivalent oxide thickness, $t_{eq}$. Gate dielectric layers or layers containing atomic layer deposited $ZrAl_xO_y$ are formed having a dielectric constant substantially higher than that of silicon oxide, where the $ZrAl_xO_y$ dielectric layers are capable of a $t_{eq}$ thinner than 10 Å, thinner than the expected limit for $SiO_2$ gate dielectrics. The thinner $t_{eq}$ of these dielectric layers allows for a higher capacitance than $SiO_2$ gate dielectrics, which provides further effective scaling for microelectronic devices and systems. At the same time, the physical thickness of the atomic layer deposited $ZrAl_xO_y$ dielectric layer is much larger than the $SiO_2$ thickness associated with the $t_{eq}$ limit of $SiO_2$. Forming the larger thickness aids in the manufacturing process for gate dielectrics and other dielectric layers.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter includes any other applications in which the above structures and fabrication methods are used. The scope of the present subject matter should be determined with reference to the appended claims, along with the full scope of equivalents to which such claims are entitled.

What is claimed is:

1. A method of forming a dielectric layer comprising:
    pulsing a precursor containing zirconium onto a substrate in a cycle of an atomic layer deposition;
    pulsing a first precursor containing oxygen in the cycle;
    pulsing a precursor containing aluminum in the cycle; and
    pulsing a second precursor containing oxygen in the cycle to form $ZrAl_xO_y$ by atomic layer deposition such that an interfacial layer between the substrate and the dielectric is limited to less than about 1 nm, wherein each precursor is individually pulsed and, following each of the pulsing of the precursors, a reaction chamber containing the substrate is purged with a purging gas, evacuated, or both purged with a purging gas and evacuated wherein the dielectric layer containing $ZrAl_xO_y$ contains a substantial amount of $Zr_4AlO_9$.

2. The method of claim 1, wherein pulsing the precursor containing zirconium includes pulsing a precursor containing both zirconium and oxygen.

3. The method of claim 1, wherein pulsing the precursor containing aluminum includes pulsing a precursor containing both aluminum and oxygen.

4. A method of forming a dielectric layer comprising:
pulsing a precursor containing zirconium onto a substrate;
pulsing a first precursor containing oxygen;
pulsing a precursor containing aluminum; and
pulsing a second precursor containing oxygen to form $ZrAl_xO_y$ by atomic layer deposition, wherein the method further includes pulsing the precursor containing zirconium, pulsing the first precursor containing oxygen, pulsing the precursor containing aluminum, and pulsing the second precursor containing oxygen to form a dielectric layer containing $Zr_4AlO_9$.

5. The method of claim 4, wherein the method further includes limiting an interfacial layer of silicon oxide or a silicate between the substrate and the $Zr_4AlO_9$ to less than about 1 nm.

6. The method of claim 1, wherein the method further includes limiting an interfacial layer of silicon oxide or a silicate between the substrate and the $ZrAl_xO_y$ to less than about 1 nm.

7. The method of claim 1, wherein pulsing a precursor containing zirconium includes pulsing a precursor selected from a group consisting of $ZrCl_4$ and $ZrI_4$.

8. The method of claim 1, wherein pulsing a precursor containing aluminum includes pulsing a precursor selected from a group consisting of trimethylaluminum and DMEAA.

9. The method of claim 1, wherein pulsing a first precursor containing oxygen and pulsing a second precursor containing oxygen includes pulsing a precursor selected from a group consisting of $H_2O$, $H_2O_2$, and a $H_2O$—$H_2O_2$ mixture.

10. The method of claim 1, wherein the method further includes preparing the substrate as a chemical oxide-terminated silicon surface prior to forming the $ZrAl_xO_y$ by atomic layer deposition.

11. The method of claim 1, wherein the method further includes preparing the substrate with a final HF rinse prior to forming the $ZrAl_xO_y$ by atomic layer deposition.

12. A method of forming a capacitor, comprising:
forming a first conductive layer on a substrate;
forming a dielectric layer containing $ZrAl_xO_y$ on the first conductive layer; and
forming a second conductive layer on the dielectric layer, wherein forming the dielectric layer includes:
pulsing a precursor containing zirconium onto the first conductive layer in a cycle of an atomic layer deposition;
pulsing a first precursor containing oxygen in the cycle;
pulsing a precursor containing aluminum in the cycle; and
pulsing a second precursor containing oxygen in the cycle to form $ZrAl_xO_y$ by atomic layer deposition on the first conductive layer, wherein each precursor is individually pulsed and, following each of the pulsing of the precursors, a reaction chamber containing the substrate is purged with a purging gas, evacuated, or both purged with a purging gas and evacuated wherein the dielectric layer containing $ZrAl_xO_y$ contains a substantial amount of $Zr_4AlO_9$.

13. The method of claim 12, wherein pulsing the precursor containing zirconium includes pulsing a precursor containing both zirconium and oxygen.

14. The method of claim 12, wherein pulsing the precursor containing aluminum includes pulsing a precursor containing both aluminum and oxygen.

15. The method of claim 12, wherein the method further includes pulsing the precursor containing zirconium, pulsing the first precursor containing oxygen, pulsing the precursor containing aluminum, and pulsing the second precursor containing oxygen to form a dielectric layer containing $Zr_4AlO_9$.

16. The method of claim 15, wherein the method further includes limiting an interfacial layer of silicon oxide or a silicate between the first conductive layer and the $Zr_4AlO_9$ to less than about 1 nm.

17. The method of claim 12, wherein the method further includes limiting an interfacial layer between the first conductive layer and the $ZrAl_xO_y$ to less than about 1 nm.

18. The method of claim 12, wherein pulsing a precursor containing zirconium includes pulsing a precursor selected from a group consisting of $ZrCl_4$ and $ZrI_4$.

19. The method of claim 12, wherein pulsing a precursor containing aluminum includes pulsing a precursor selected from a group consisting of trimethylaluminum and DMEAA.

20. The method of claim 12, wherein pulsing a first precursor containing oxygen and pulsing a second precursor containing oxygen includes pulsing a precursor selected from a group consisting of $H_2O$, $H_2O_2$, and a $H_2O$—$H_2O_2$ mixture.

21. The method of claim 12, wherein the method further includes preparing the substrate as a chemical oxide-terminated silicon surface prior to forming the $ZrAl_xO_y$ by atomic layer deposition.

22. The method of claim 12, wherein the method further includes preparing the substrate with a final HF rinse prior to forming the $ZrAl_xO_y$ by atomic layer deposition.

23. A method of forming a transistor comprising:
forming a source region and a drain region in a substrate, the source region and the drain region separated by a body region;
forming a dielectric layer containing $ZrAl_xO_y$ on the body region between the source and drain regions; and
coupling a gate to the dielectric layer, wherein forming the dielectric layer includes:
pulsing a precursor containing zirconium onto the body region in a cycle of an atomic layer deposition;
pulsing a first precursor containing oxygen in the cycle;
pulsing a precursor containing aluminum in the cycle; and
pulsing a second precursor containing oxygen in the cycle to form $ZrAl_xO_y$ by atomic layer deposition on the body region, wherein each precursor is individually pulsed and, following each of the pulsing of the precursors, a reaction chamber containing the substrate is purged with a purging gas, evacuated, or both purged with a purging gas and evacuated wherein the dielectric layer containing $ZrAl_xO_y$ contains a substantial amount of $Zr_4AlO_9$.

24. The method of claim 23, wherein pulsing the precursor containing zirconium includes pulsing a precursor containing both zirconium and oxygen.

25. The method of claim 23, wherein pulsing the precursor containing aluminum includes pulsing a precursor containing both aluminum and oxygen.

26. The method of claim 23, wherein the method further includes pulsing the precursor containing zirconium, pulsing the first precursor containing oxygen, pulsing the precursor containing aluminum, and pulsing the second precursor containing oxygen to form a dielectric layer containing $Zr_4AlO_9$.

27. The method of claim 26, wherein the method further includes limiting an interfacial layer of silicon oxide or a silicate between the substrate and the $Zr_4AlO_9$ to less than about 1 nm.

28. The method of claim 23, wherein the method further includes limiting an interfacial layer between the substrate and the $ZrAl_xO_y$ to less than about 1 nm.

29. The method of claim 23, wherein pulsing a precursor containing zirconium includes pulsing a precursor selected from a group consisting of $ZrCl_4$ and $ZrI_4$.

30. The method of claim 23, wherein pulsing a precursor containing aluminum includes pulsing a precursor selected from a group consisting of trimethylaluminum and DMEAA.

31. The method of claim 23, wherein pulsing a first precursor containing oxygen and pulsing a second precursor containing oxygen includes pulsing a precursor selected from a group consisting of $H_2O$, $H_2O_2$, and a $H_2O$—$H_2O_2$ mixture.

32. The method of claim 23, wherein the method further includes preparing the substrate as a chemical oxide-terminated silicon surface prior to forming the $ZrAl_xO_y$ by atomic layer deposition.

33. The method of claim 23, wherein the method further includes preparing the substrate with a final HF rinse prior to forming the $ZrAl_xO_y$ by atomic layer deposition.

34. A method of forming a memory comprising:
forming a number of access transistors, forming at least one of the access transistors including forming a dielectric layer containing $ZrAl_xO_y$ on a body region in a substrate between a source region and a drain region;
forming a number of word lines coupled to the number of access transistors; and
forming a number of bit lines coupled to the number of access transistors, wherein forming the dielectric layer includes:
pulsing a precursor containing zirconium onto the body region in a cycle of an atomic layer deposition;
pulsing a first precursor containing oxygen in the cycle;
pulsing a precursor containing aluminum in the cycle; and
pulsing a second precursor containing oxygen in the cycle to form $ZrAl_xO_y$ by atomic layer deposition on the body region, wherein each precursor is individually pulsed and, following each of the pulsing of the precursors, a reaction chamber containing the substrate is purged with a purging gas, evacuated, or both purged with a purging gas and evacuated wherein the dielectric layer containing $ZrAl_xO_y$ contains a substantial amount of $Zr_4AlO_9$.

35. The method of claim 34, wherein pulsing the precursor containing zirconium includes pulsing a precursor containing both zirconium and oxygen.

36. The method of claim 34, wherein pulsing the precursor containing aluminum includes pulsing a precursor containing both aluminum and oxygen.

37. The method of claim 34, wherein the method further includes pulsing the precursor containing zirconium, pulsing the first precursor containing oxygen, pulsing the precursor containing aluminum, and pulsing the second precursor containing oxygen to form a dielectric layer containing $Zr_4AlO_9$.

38. The method of claim 37, wherein the method further includes limiting an interfacial layer of silicon oxide or a silicate between the substrate and the $Zr_4AlO_9$ to less than about 1 nm.

39. The method of claim 34, wherein the method further includes limiting an interfacial layer between the substrate and the $ZrAl_xO_y$ to less than about 1 nm.

40. The method of claim 34, wherein pulsing a precursor containing zirconium includes pulsing a precursor selected from a group consisting of $ZrCl_4$ and $ZrI_4$.

41. The method of claim 34, wherein pulsing a precursor containing aluminum includes pulsing a precursor selected from a group consisting of trimethylaluminum and DMEAA.

42. The method of claim 34, wherein pulsing a first precursor containing oxygen and pulsing a second precursor containing oxygen includes pulsing a precursor selected from a group consisting of $H_2O$, $H_2O_2$, and a $H_2O$—$H_2O_2$ mixture.

43. The method of claim 34, wherein the method further includes preparing the substrate as a chemical oxide-terminated silicon surface prior to forming the $ZrAl_xO_y$ by atomic layer deposition.

44. The method of claim 34, wherein the method further includes preparing the substrate with a final HF rinse prior to forming the $ZrAl_xO_y$ by atomic layer deposition.

45. A method of forming an electronic system comprising:
providing a processor;
coupling a memory to the processor, wherein the memory is formed by a method including:
forming a number of access transistors, forming at least one of the access transistors including forming a dielectric layer containing $ZrAl_xO_y$ on a body region in a substrate between a source region and a drain region;
forming a number of word lines coupled to number of access transistors; and
forming a number of bit lines coupled to the number of access transistors, wherein forming the dielectric layer includes:
pulsing a precursor containing zirconium onto the body region in a cycle of an atomic layer deposition;
pulsing a first precursor containing oxygen in the cycle;
pulsing a precursor containing aluminum in the cycle; and
pulsing a second precursor containing oxygen in the cycle to form $ZrAl_xO_y$ by atomic layer deposition on the body region, wherein each precursor is individually pulsed and, following each of the pulsing of the precursors, a reaction chamber containing the substrate is purged with a purging gas, evacuated, or both purged with a purging gas and evacuated.

46. The method of claim 45, wherein pulsing the precursor containing zirconium includes pulsing a precursor containing both zirconium and oxygen.

47. The method of claim 45, wherein pulsing the precursor containing aluminum includes pulsing a precursor containing both aluminum and oxygen.

48. The method of claim 45, wherein the method further includes pulsing the precursor containing zirconium, pulsing the first precursor containing oxygen, pulsing the precursor containing aluminum, and pulsing the second precursor containing oxygen to form a dielectric layer containing $Zr_4AlO_9$.

49. The method of claim 48, wherein the method further includes limiting an interfacial layer of silicon oxide or a silicate between the substrate and the $Zr_4AlO_9$ to less than about 1 nm.

50. The method of claim 45, wherein the method further includes limiting an interfacial layer between the substrate and the $ZrAl_xO_y$ to less than about 1 nm.

51. The method of claim 45, wherein pulsing a precursor containing zirconium includes pulsing a precursor selected from a group consisting of $ZrCl_4$ and $ZrI_4$.

52. The method of claim 45, wherein pulsing a precursor containing aluminum includes pulsing a precursor selected from a group consisting of trimethylaluminum and DMEAA.

53. The method of claim 45, wherein pulsing a first precursor containing oxygen and pulsing a second precursor containing oxygen includes pulsing a precursor selected from a group consisting of $H_2O$, $H_2O_2$, and a $H_2O$—$H_2O_2$ mixture.

54. The method of claim 45, wherein the method further includes preparing the substrate as a chemical oxide-terminated silicon surface prior to forming the $ZrAl_xO_y$ by atomic layer deposition.

55. The method of claim 45, wherein the method further includes preparing the substrate with a final HF rinse prior to forming the $ZrAl_xO_y$ by atomic layer deposition.

56. A method of forming a dielectric layer comprising:
pulsing a precursor containing zirconium onto a substrate in a cycle of an atomic layer deposition;
pulsing a first precursor containing oxygen in the cycle;
pulsing a precursor containing aluminum in the cycle; and
pulsing a second precursor containing oxygen in the cycle to form $ZrAl_xO_y$ by atomic layer deposition, wherein each precursor is individually pulsed and, following each of the pulsing of the precursors, a reaction chamber containing the substrate is purged with a purging gas, evacuated, or both purged with a purging gas and evacuated wherein the dielectric layer containing $ZrAl_xO_y$ contains a substantial amount of $Zr_4AlO_9$.

57. The method of claim 56, wherein the method includes forming an amorphous structure with an approximate average composition $Zr_4AlO_9$.

58. The method of claim 56, wherein the method further includes limiting an interfacial layer between the substrate and the $ZrAl_xO_y$ to less than about 1 nm.

59. The method of claim 56, wherein pulsing a precursor containing zirconium includes pulsing a $ZrI_4$ precursor.

60. The method of claim 56, wherein pulsing a precursor containing aluminum includes pulsing a trimethylaluminum precursor.

61. The method of claim 56, wherein pulsing a precursor containing zirconium includes pulsing a $ZrCl_4$ precursor.

62. The method of claim 56, wherein pulsing a precursor containing aluminum includes pulsing a DMEAA precursor.

63. The method of claim 56, wherein pulsing a first precursor containing oxygen and pulsing a second precursor containing oxygen includes pulsing a precursor selected from a group consisting of $H_2O$, $H_2O_2$, and a $H_2O$—$H_2O_2$ mixture.

64. The method of claim 56, wherein the method further includes preparing the substrate as a chemical oxide-terminated silicon surface prior to forming the $ZrAl_xO_y$ by atomic layer deposition.

65. The method of claim 56, wherein the method further includes preparing the substrate with a final HF rinse prior to forming the $ZrAl_xO_y$ by atomic layer deposition.

* * * * *

UNITED STATES PATENT AND TRADEMARK OFFICE
CERTIFICATE OF CORRECTION

| | | |
|---|---|---|
| PATENT NO. | : 7,135,369 B2 | Page 1 of 2 |
| APPLICATION NO. | : 10/403734 | |
| DATED | : November 14, 2006 | |
| INVENTOR(S) | : Ahn et al. | |

It is certified that error appears in the above-identified patent and that said Letters Patent is hereby corrected as shown below:

On page 2, in field (56), under "U.S. Patent Documents", in Column 1, line 2, after "Wallace et al." delete "257/918" and insert -- 257/410 --, therefor.

On page 2, in field (56), under "U.S. Patent Documents", in column 1, line 4, after "Ma et al." delete "257/418" and insert -- 257/410 --, therefor.

On page 2, in field (56), under "U.S. Patent Documents", in column 1, line 14, after "Halliyal et al." delete "438/300" and insert -- 438/200 --, therefor.

On page 2, in field (56), under "U.S. Patent Documents", in column 1, line 22, after "Matijasevic et al." delete "118/219" and insert -- 118/719 --, therefor.

On page 2, in field (56), under "U.S. Patent Documents", in column 1, line 43, after "Marsh" delete "257/305" and insert -- 257/306 --, therefor.

On page 2, in field (56), under "U.S. Patent Documents", in column 1, line 56, after "Banerjee et al." delete "438/278" and insert -- 438/238 --. therefor.

On page 2, in field (56), under "U.S. Patent Documents", in column 2, line 49, after "Ahn" delete "435/215' and insert -- 438/216 --, therefor.

On page 2, in field (56), under "U.S. Patent Documents", in column 2, line 54, after "Sandhu" delete "427/28.28" and insert -- 427/255.28 --, therefor.

On page 2, in field (56), under "U.S. Patent Documents", in column 2, line 61, after "Ahn et al." delete "427/299.34" and insert -- 427/255.34 --, therefor.

On page 3, in field (56), under "U.S. Patent Documents", in column 1, line 3, after "Ahn" delete "438/428" and insert -- 438/128 --, therefor.

On page 3, in field (56), under "U.S. Patent Documents", in column 1, line 16, after "Conley, Jr. et al." delete "438/783" and insert -- 438/785 --, therefor.

On page 3, in field (56), under "Other Publications", in column 1, line 7, delete "-nanolaminated" and insert -- -nanolaminates --, therefor.

On page 3, in field (56), under "Other Publications", in column 1, line 9, delete "Techincal." and insert -- Technical. --, therefor.

UNITED STATES PATENT AND TRADEMARK OFFICE
CERTIFICATE OF CORRECTION

PATENT NO. : 7,135,369 B2
APPLICATION NO. : 10/403734
DATED : November 14, 2006
INVENTOR(S) : Ahn et al.

It is certified that error appears in the above-identified patent and that said Letters Patent is hereby corrected as shown below:

On page 3, in field (56), under "Other Publications", in column 2, line 3, delete "depositon," and insert -- deposition -- therefor.

On page 3, in field (56), under "Other Publications", in column 2, line 19, delete "form" and insert -- from --, therefor.

On page 3, in field (56), under "Other Publications", in column 2, line 25, delete "stabillity" and insert -- stability --, therefor.

On page 3, in field (56), under "Other Publications", in column 2, line 46, delete "depoosition" and insert -- deposition --, therefor.

On page 3, in field (56), under "Other Publications", in column 2, line 70, delete "Al2O3" and insert -- $Al_2O_3$ --. therefor.

On page 4, in field (56), under "Other Publications", in column 2, line 2, delete "Jouranl" and insert -- Journal --, therefor.

In column 14, line 63, delete "dieletric" and insert -- dielectric --, therefor.

Signed and Sealed this

Third Day of April, 2007

JON W. DUDAS
*Director of the United States Patent and Trademark Office*